United States Patent
Wang et al.

(10) Patent No.: US 11,550,073 B2
(45) Date of Patent: Jan. 10, 2023

(54) ENHANCED-RESOLUTION ROCK FORMATION BODY WAVE SLOWNESS DETERMINATION FROM BOREHOLE GUIDED WAVES

(71) Applicant: HALLIBURTON ENERGY SERVICES, INC., Houston, TX (US)

(72) Inventors: Ruijia Wang, Singapore (SG); Chung Chang, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 882 days.

(21) Appl. No.: 16/338,732

(22) PCT Filed: Oct. 25, 2016

(86) PCT No.: PCT/US2016/058659
§ 371 (c)(1),
(2) Date: Apr. 2, 2019

(87) PCT Pub. No.: WO2018/080450
PCT Pub. Date: May 3, 2018

(65) Prior Publication Data
US 2021/0286099 A1  Sep. 16, 2021

(51) Int. Cl.
  *G01V 1/50* (2006.01)
  *G06F 30/20* (2020.01)
  *E21B 49/00* (2006.01)
(52) U.S. Cl.
  CPC .............. *G01V 1/50* (2013.01); *E21B 49/00* (2013.01); *G06F 30/20* (2020.01);
  (Continued)
(58) Field of Classification Search
  None
  See application file for complete search history.

(56) References Cited

U.S. PATENT DOCUMENTS 5,587,966 A  12/1996  Kimball et al.
6,477,112 B1  11/2002  Tang et al.
(Continued)

FOREIGN PATENT DOCUMENTS

CA  2506835 A1  11/2005
CA  2829764 A1  9/2012
(Continued)

OTHER PUBLICATIONS

D. Close, D. Cho, F. Horn, and H. Edmundson; The Sound of Sonic: A Historical Perspective and Introduction to Acoustic Logging, CSEG Recorder (Year: 2009).*
(Continued)

*Primary Examiner* — Lina M Cordero
(74) *Attorney, Agent, or Firm* — Novak Druce Carroll LLP

(57) ABSTRACT

An apparatus, method, and system for determining body wave slowness from guided borehole waves. The method includes selecting a target axial resolution based on the size of a receiver array, obtaining a plurality of waveform data sets corresponding to a target formation zone and each acquired at a different shot position, computing a slowness-frequency 2D dispersion semblance map for each waveform data set, stacking the slowness-frequency 2D dispersion semblance maps to generate a stacked 2D semblance map, and determining a body wave slowness from the extracted dispersion curve. The method may also include generating a self-adaptive weighting function based on a dispersion model and the extracted dispersion curve, fitting the weighted dispersion curve and the dispersion model to determine a body wave slowness that minimizes the misfit between the weighted dispersion curve and the dispersion model. The method can be applied to both frequency-domain and time-domain processing.

10 Claims, 17 Drawing Sheets

(52) U.S. Cl.
CPC ...... *E21B 2200/20* (2020.05); *G01V 2200/16* (2013.01); *G01V 2210/1299* (2013.01); *G01V 2210/1429* (2013.01); *G01V 2210/47* (2013.01); *G01V 2210/612* (2013.01); *G01V 2210/6222* (2013.01)

(56) References Cited

U.S. PATENT DOCUMENTS

| | | | |
|---|---|---|---|
| 6,654,688 | B1 | 11/2003 | Brie et al. |
| 7,120,541 | B2 | 10/2006 | Wang |
| 7,643,374 | B2 | 1/2010 | Plona et al. |
| 7,698,066 | B2 | 4/2010 | Huang et al. |
| 9,354,342 | B2 | 5/2016 | Mandal |
| 2004/0001389 | A1* | 1/2004 | Tang ............... G01V 1/50 366/31 |
| 2005/0261835 | A1 | 11/2005 | Wang |
| 2007/0097788 | A1 | 5/2007 | Tang et al. |
| 2008/0144439 | A1 | 6/2008 | Plona et al. |
| 2009/0067286 | A1* | 3/2009 | Bose ............... G01V 1/48 367/38 |
| 2010/0085835 | A1 | 4/2010 | Tang et al. |
| 2012/0147702 | A1 | 6/2012 | Valero et al. |
| 2014/0056101 | A1 | 2/2014 | Vu et al. |
| 2014/0169127 | A1* | 6/2014 | Orban ............... G01V 1/40 367/25 |
| 2015/0253447 | A1 | 9/2015 | Mukhopadhyay et al. |
| 2016/0291189 | A1 | 10/2016 | Collins |

FOREIGN PATENT DOCUMENTS

| | | |
|---|---|---|
| CA | 2888529 A1 | 5/2014 |
| EP | 2686708 A1 | 1/2014 |
| EP | 2914981 A4 | 11/2015 |
| WO | 2010040087 A2 | 4/2010 |
| WO | 2010040087 A3 | 7/2010 |
| WO | 2012125161 A1 | 9/2012 |
| WO | 2014070182 A1 | 5/2014 |

OTHER PUBLICATIONS

Mukhopadhyay, "The Differential-Phase Based Time-and Frequency-Semblance Algorithm for Array-Acoustic Processing and Its Application to Formation-Slowness Measurement," Petrophysics: the SPWLA Journal of Formation Evaluation and Reservoir Description., vol. 54 (Year: 2013).*

Said Assous and Peter Elkington, "Phase-based dispersion analysis for acoustic array borehole logging data", The Journal of the Acoustical Society of America 135, 1919-1928 (2014) https://doi.org/10.1121/1.4868396 (Year: 2014).*

Wathelet, Marc & Jongmans, D. & Ohrnberger, Matthias. (2004). Surface-wave inversion using a direct search algorithm and its application to ambient vibration measurements. Near Surface Geophysics—Near Surf Geophys. 2. 10.3997/1873-0604.2004018 (Year: 2004).*

International Search Report and Written Opinion; PCT/US2016/058659; dated Jul. 24, 2017.

* cited by examiner

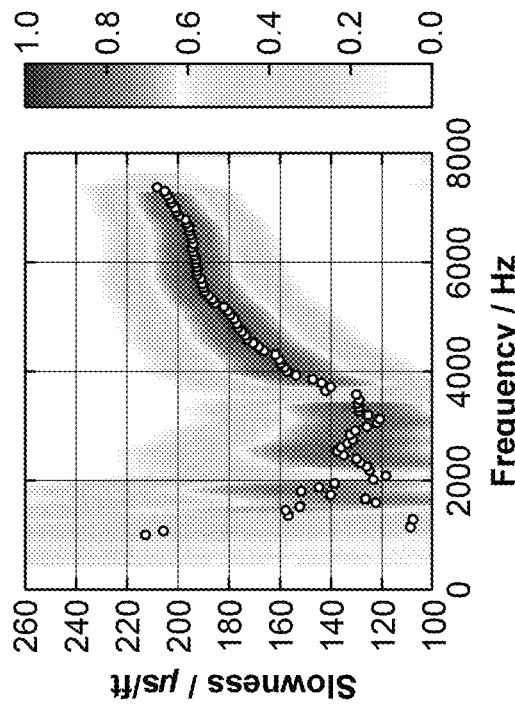
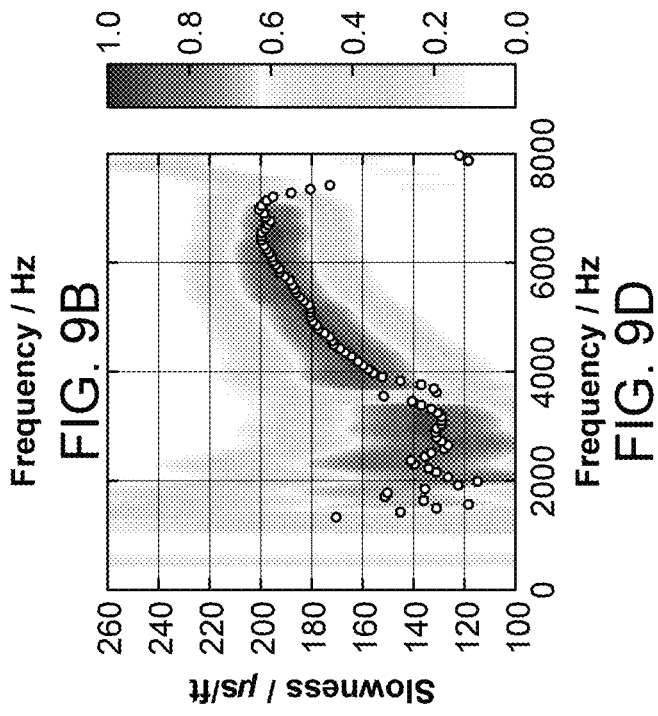
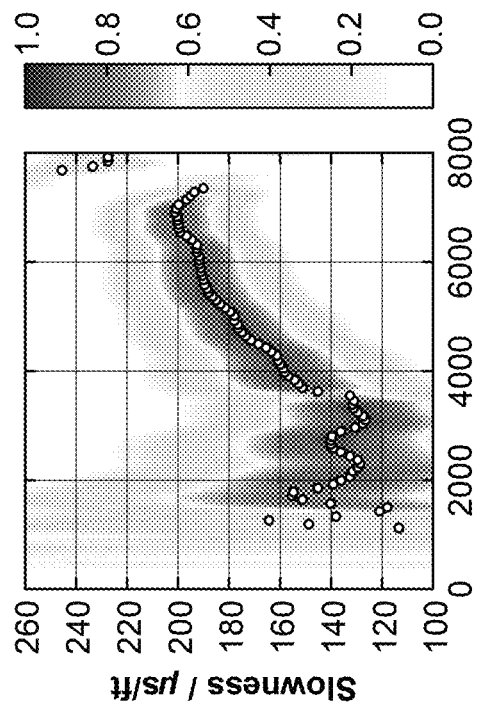
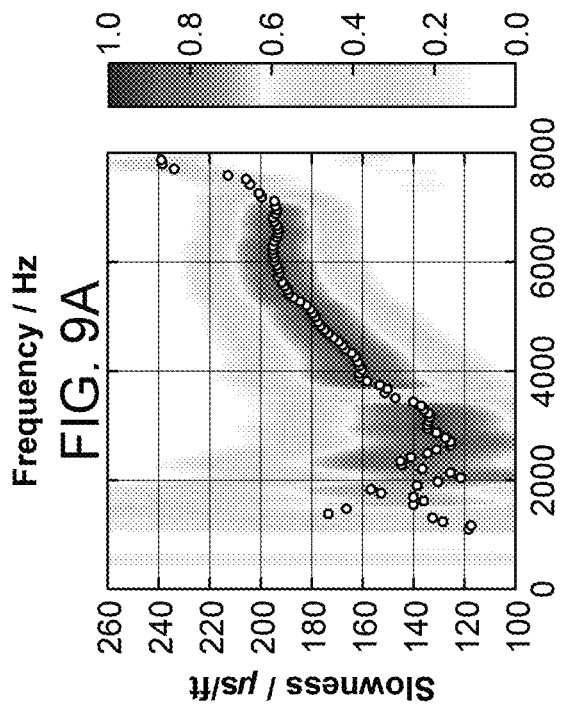
FIG. 9A
FIG. 9B
FIG. 9C
FIG. 9D

ENHANCED-RESOLUTION ROCK FORMATION BODY WAVE SLOWNESS DETERMINATION FROM BOREHOLE GUIDED WAVES

CROSS-REFERENCE TO RELATED APPLICATIONS

This application is a national stage entry of PCT/US2016/058659 filed Oct. 25, 2016, said application is expressly incorporated herein in its entirety.

FIELD

The present disclosure relates to improved sonic logging methods in subterranean wellbores. In particular, the present disclosure relates to devices, methods, and systems, for improved slowness resolution using borehole guided waves.

BACKGROUND

Wellbores are drilled into the earth for a variety of purposes including tapping into hydrocarbon bearing formations to extract the hydrocarbons for use as fuel, lubricants, chemical production, and other purposes. In order to facilitate processes and operations in the wellbore, various tools may be conveyed downhole. For example, sonic logging tools may be lowered into the wellbore in order to facilitate petrophysical interpretation and petroleum engineering analysis. Sonic logging provides various properties of the rock formation and borehole fluid, including, for example, the formation compressional and shear wave slowness, formation permeability, formation shear slowness anisotropy and borehole mud slowness. Among these properties, compressional and shear wave slowness is one of the most important as it provides fundamental dynamic elastic properties of the formation.

Rock formation body wave slowness, e.g., compressional and shear wave slowness, provides useful information for mechanical characterization, lithological interpretation and rock physics analysis of underground rock properties, and thus have become essential measurements in the oil and gas industry during wireline logging (WL) and logging while drilling (LWD). Generally speaking, dipole sources are generally utilized for shear slowness estimating in wireline logging, because the low-frequency dipole flexural wave slowness asymptotes approach body shear wave slowness of different formations. However, flexural low-frequency signals are generally associated with low signal-to-noise-ratio (SNR) because of their poor excitation amplitude at low-frequencies. To overcome the insufficient SNR, modern acoustic logging tools are designed to increase SNR at low frequencies by using a larger receiver array. Large-span array processing is very effective in improving slowness picking quality at low frequencies, however such a large-span receiver array may compromise the spatial resolution of shear slowness logs. This is especially true for laminated formations having thin layers or strong heterogeneous formations, in which case data processing using the whole array yields averaged shear slowness of several layers resulting in some thin layers being unidentifiable due the low spatial resolution. Therefore, averaged slowness logs are biased away from accurate shear slowness characterization of fine layers and may not be useful to identify thin layers or amenable to advanced rock physics analysis.

The compressional wave slowness evaluation from leaky-P waves in soft formations has similar problems. In soft formations, leaky-P wave slowness approaches formation compressional wave slowness at low-frequencies, where the SNR of the data is not good to their low excitation frequency at those frequencies. Large-span receiver array processing is often used to improve SNR, which consequently leads to lower slowness resolution and that compromises thin bed interpretation. Additionally, processing screw waves to obtain shear slowness in LWD environments is plagued by similar issues. Consequently, it is desirable to develop a processing and work-flow method capable of improving slowness resolution using borehole guided waves.

BRIEF DESCRIPTION OF THE DRAWINGS

In order to describe the manner in which the advantages and features of the disclosure can be obtained, reference is made to embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1:
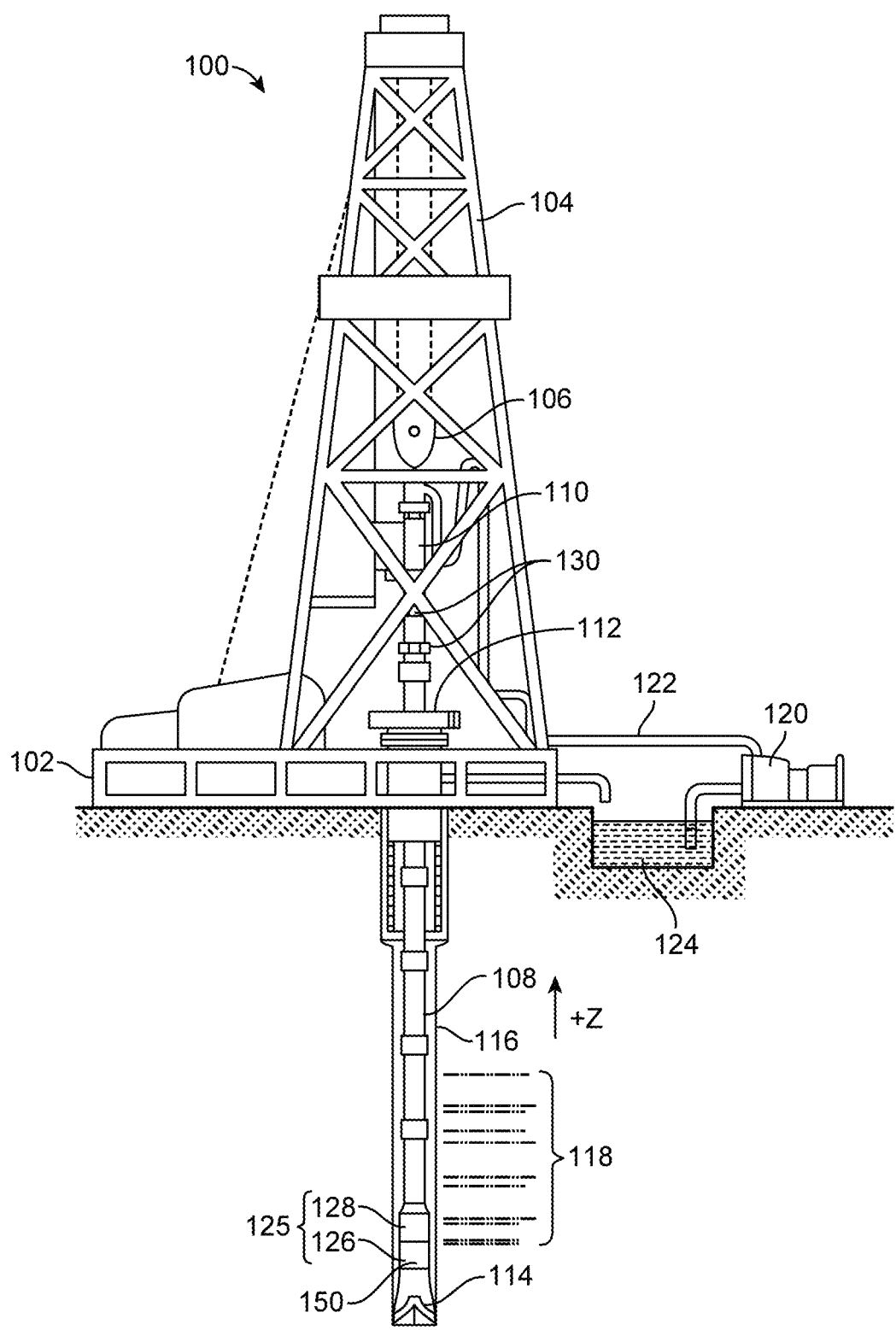
FIG. 1 is a diagram of a logging while drilling (LWD) or measurement while drilling (MWD) wellbore operating environment in which the presently disclosed apparatus, method, and system may be deployed, according to an exemplary embodiment of the present disclosure.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

It should be understood at the outset that although illustrative implementations of one or more embodiments are illustrated below, the disclosed apparatus and methods may be implemented using any number of techniques. The disclosure should in no way be limited to the illustrative implementations, drawings, and techniques illustrated herein, but may be modified within the scope of the appended claims along with their full scope of equivalents.

Unless otherwise specified, any use of any form of the terms "connect," "engage," "couple," "attach," or any other term describing an interaction between elements is not meant to limit the interaction to direct interaction between the elements and also may include indirect interaction between the elements described. In the following discussion and in the claims, the terms "including" and "comprising" are used in an open-ended fashion, and thus should be interpreted to mean "including, but not limited to . . . ". Reference to up or down will be made for purposes of description with "up," "upper," "upward," "upstream," or "uphole" meaning toward the surface of the wellbore and with "down," "lower," "downward," "downstream," or "downhole" meaning toward the terminal end of the well, regardless of the wellbore orientation. The various characteristics described in more detail below, will be readily apparent to those skilled in the art with the aid of this disclosure upon reading the following detailed description, and by referring to the accompanying drawings.

Conventional acoustic data processing, for example, compressional slowness tracking, operates in the time-domain with various semblance/coherence based methods. These methods generally work well as the borehole compressional waves are usually not dispersive and the time-domain processing is able to obtain the waves with the best coherence or quality. However, in other cases, for example, shear slowness tracking from flexural/screw waves produced by a dipole/quadrupole source, or compressional wave slowness tracking from the leaky-P waves which are excited by a monopole, a dipole, or a quadrupole source, such types of methods may be unsuitable for the time domain processing method. Because these guided waves (e.g., flexural waves, screw waves, leaky-P waves) are highly dispersive and their low-frequency asymptotes approach body wave slowness, the body wave slowness is extracted from the low-frequency part of the guided waves. However, the excitation amplitude of these waves tends to be small when their slowness approaches the body wave slowness, causing low SNR at low-frequencies. In order to improve signal to noise ratio at low frequencies, a larger-span receiver array is adopted and the noise level is improved due to stacking.

In general, such large-array processing is effective and stable, and provides stable and accurate slowness logs. However, in some cases, for example, for the characterization of laminated formations or strong heterogeneous formations, large-span array processing results, which are considered to be a weighted average of all formations within the corresponding receiver array aperture, are deviated away from true formation slowness, and they may not be able to reveal the desired rock layering information due their low spatial resolution. Consequently, it is desirable to develop a processing method and work-flow that could improve slowness resolution using borehole guided waves.

There have been a variety of processing methods that could be used to extract rock formation compressional/shear wave slowness from borehole guided waves (e.g., flexural waves, screw waves, leaky-P waves). Generally, those methods are divided into two categories: modeling based methods and data driven methods. Modeling-based methods deliver body wave slowness by decreasing the misfit between the measurements and modeling data at certain frequencies. The modeling data are forward computed by analytical and numerical simulation. In some cases, modeling-based methods provide stable and reliable results. However, in other cases, the application of such forward modeling based methods may have limitations due to the fact that the model may not fit the measurements well because some factors or parameters might not be considered in the forward model.

Another group of processing methods are data-driven methods that utilize a flexible or simplified model approach. Such flexible or simplified models may include independent parameters that are able to make the model data fit the data better. Data-driven processing methods may include, for example, curve-fitting methods, parametric inversion methods, and picking the first peak in a slowness histogram. The data-driven methods have obvious advantages when the data quality of low frequency dispersion estimates is good. In other words, the processing results are accurate and reliable when the data quality is good enough to guide the model. However, when it comes to the case of complicated borehole environments, slowness dispersions with good quality may not be available, for example, a lack of low-frequency data quality may occur, especially in carrying out sub-array processing. Under such situations, the conventional data-driven approach may not provide better slowness estimates.

In order to address the above issues in guided wave data processing, larger-span receiver arrays are often employed to enhance the data quality at low-frequencies. However, the use of larger-span receiver arrays compromises the axial resolution of the slowness logs. This approach is especially problematic for thin beds or formations with strong heterogeneity, as in such circumstances, low-resolution data may lose correlation to the small geological structures, and the slowness logs may be biased toward nearby formations. Under such cases, sub-array processing is preferred. Therefore, sub-array processing methods with improved picking quality and full utilization of available waveform data is desired.

The present disclosure provides a method to enhance resolution for compressional/shear slowness logs using borehole guided waves. The present disclosure provides two approaches to improve the guide wave data processing by increasing the data redundancy and optimizing data usage by introducing a reliable data-driven weighting function. In order to increase data redundancy, waveform data obtained at different shooting locations within the wellbore are combined so as to maximize the data quantity corresponding to the same target formation zone. This is implemented by stacking semblance/coherence maps in a 2D (frequency-slowness) or a 1D (slowness) domain. The semblance map stacking method provided by the present disclosure enhances the quality of dispersion or slowness estimation.

Additionally, the present disclosure provides a self-adaptive weighting function calculated and applied in the data processing to further improve the utilization of the waveform data that have both good SNR and minimum dispersion correction quantity. This weighting function weights good quality data more than other data. The indicator of data quality may be different for different wave modes. For flexural waves, screw waves, and leaky-P waves, the data at frequencies close to the "cutoff frequency," where the guided wave slowness starts to differ from the body wave slowness, are given increased weight. This is because, at these frequencies, these waves have a larger amplitude of better SNR, and they also have a relatively small deviation to the body wave slowness. The improvements in data processing provided by the present disclosure ensures that increasing on these data could help in decreasing uncertainties of body wave slowness induced by random noise and modeling errors, and can help improve the accuracy of estimated slowness logs. The methods provided in the present disclosure may be implemented in both frequency-domain and time-domain processing.

FIG. 1 illustrates a diagrammatic view of a logging while drilling (LWD) or measurement while drilling (MWD) wellbore operating environment 100 in which the presently disclosed apparatus, method, and system, may be deployed in accordance with certain exemplary embodiments of the present disclosure. As depicted in FIG. 1, a drilling platform 102 is equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 is a drill bit 114. As the drill bit 114 rotates, the drill bit 114 creates a wellbore 116 that passes through various formations 118. A pump 120 circulates drilling fluid through a supply pipe 122 to top drive 110, down through the interior of drill string 108, through orifices in drill bit 114, back to the surface via the annulus around drill string 108, and into a retention pit 124. The drilling fluid transports cuttings from the wellbore 116 into the pit 124 and aids in maintaining the integrity of the wellbore 116. Various materials can be used for drilling fluid, including oil-based fluids and water-based fluids.

As depicted in FIG. 1, logging tools 126 are integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 130 and to receive commands from the surface. In at least some cases, the telemetry sub 128 communicates with a surface receiver 130 using mud pulse telemetry. In at least some embodiments, the telemetry sub 128 does not communicate with the surface, but rather stores logging data for later retrieval at the surface when the logging assembly is recovered.

Each of the logging tools 126 may include a plurality of tool components, spaced apart from each other, and communicatively coupled with one or more wires. Logging tools 126 may include apparatus such as that shown in FIGS. 6-8 such as to perform acoustic (i.e., "sonic") logging. The telemetry sub 128 may include wireless telemetry or logging capabilities, or both, such as to transmit or later provide information indicative of received acoustic energy to operators on the surface or for later access and data processing for the evaluation of formation 118 properties.

The logging tools 126, including the acoustic logging tool, may also include one or more computing devices 150 communicatively coupled with one or more of the plurality of tool components. The computing device 150 may be configured to control or monitor the performance of the tools 126, process logging data, and/or carry out the methods of the present disclosure.

In at least some instances, one or more of the logging tools 126 may communicate with a surface receiver 130, such as wired drillpipe. In other cases, the one or more of the logging tools 126 may communicate with a surface receiver 130 by wireless signal transmission. In at least some cases, one or more of the logging tools 126 may receive electrical power from a wire that extends to the surface, including wires extending through a wired drillpipe. In at least some instances the methods and techniques of the present disclosure may be performed by a computing device 150 on the surface. In some cases, the computing device 150 may be included in surface receiver 130. For example, surface receiver 130 of LWD or MWD wellbore operating environment 100 at the surface may include one or more of wireless telemetry, processor circuitry, or memory facilities, such as to support logging-while-drilling (LWD) or measurement-while-drilling (MWD) operations.

Figure 2:
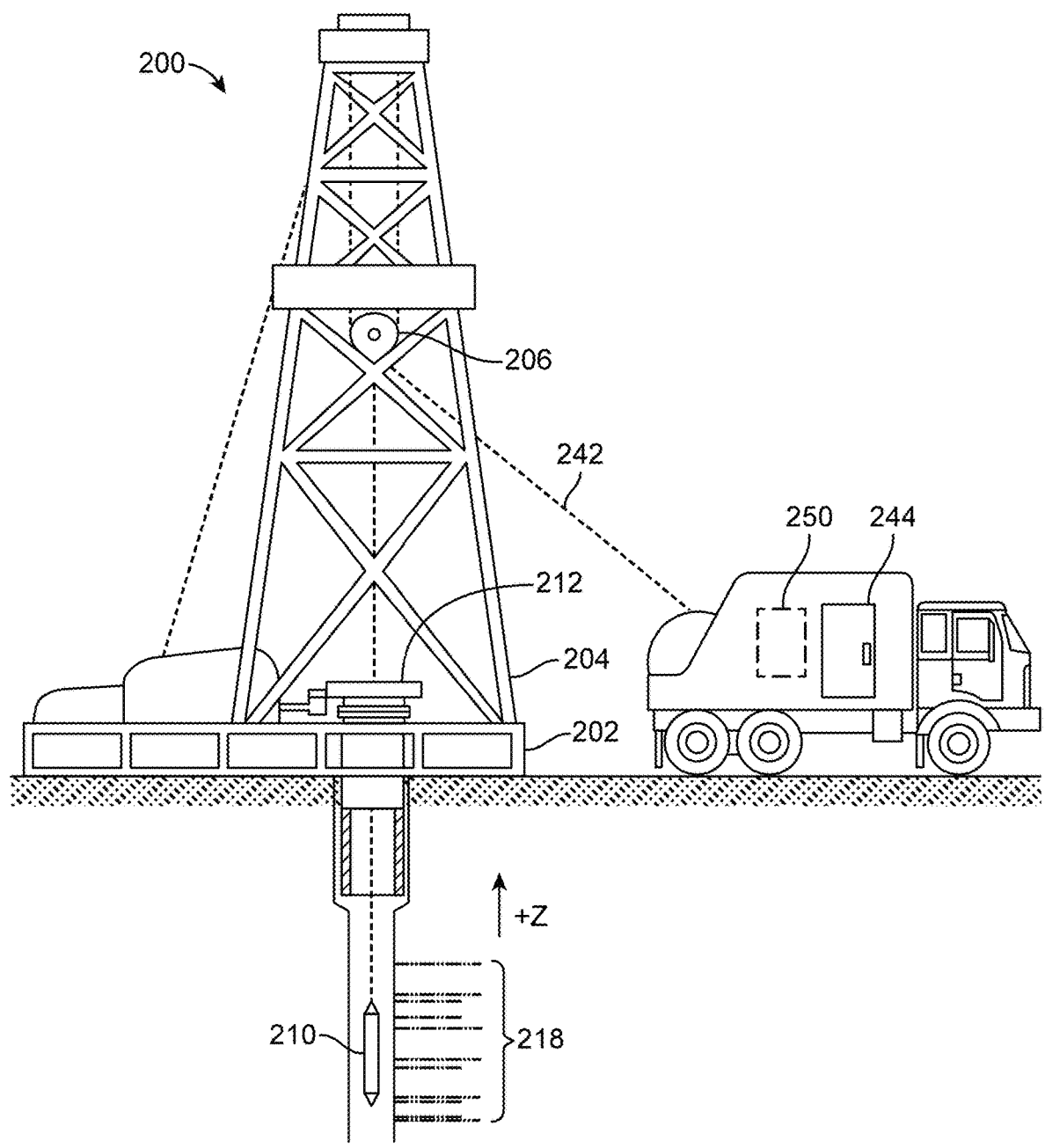
FIG. 2 illustrates a diagrammatic view of a wireline logging wellbore operating environment in which the presently disclosed apparatus, method, and system, may be deployed, according to an exemplary embodiment of the present disclosure.
Figure 6:
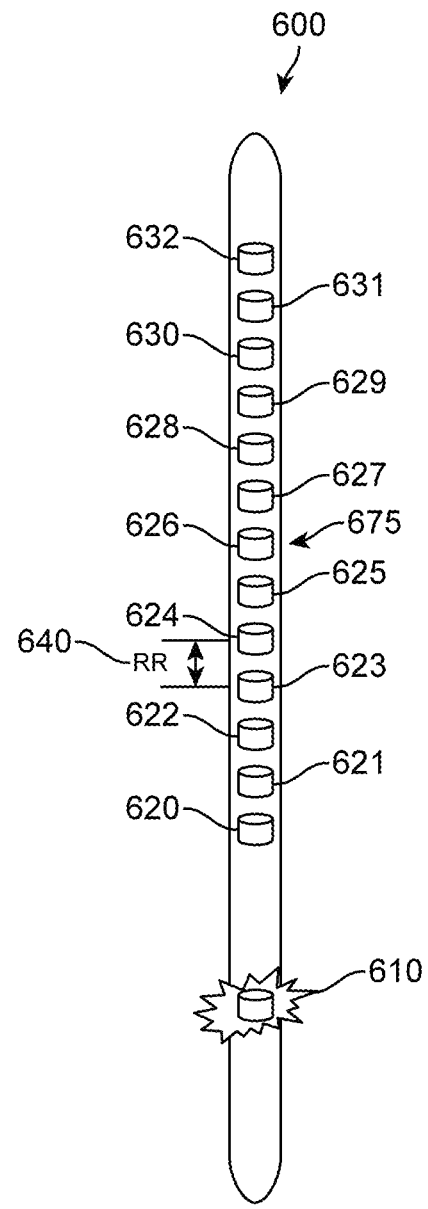
FIG. 6 illustrates a diagrammatic view of an acoustic logging tool capable of performing the presently disclosed methods and techniques, according to an exemplary embodiment of the present disclosure.
Figure 7:
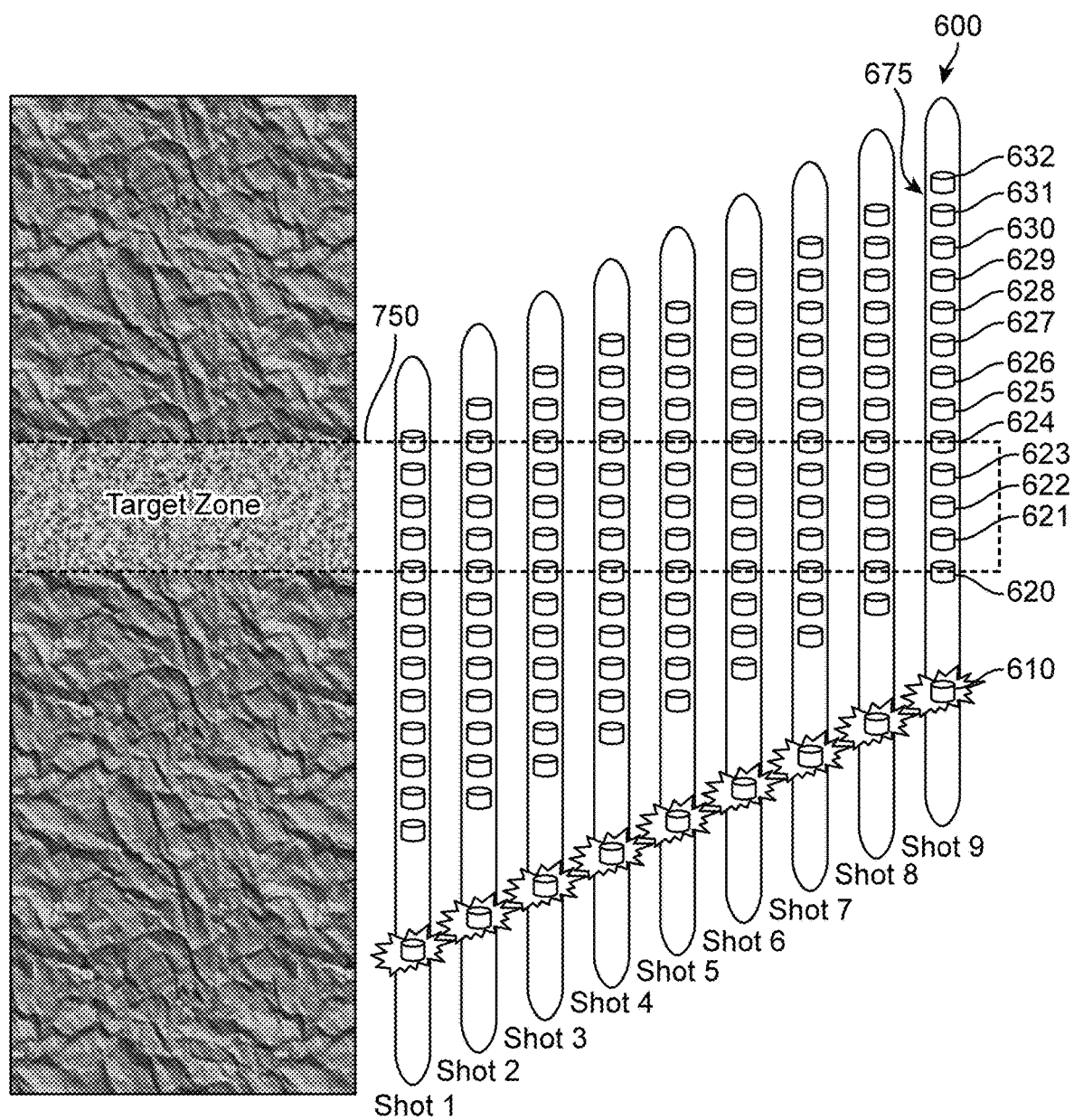
FIG. 7 illustrates a diagrammatic view of an acoustic logging tool 600 lowered in a wellbore to collect waveforms from a target zone at a plurality of shot positions according to a common transmitter gather, according to an exemplary embodiment of the present disclosure.
Figure 8:
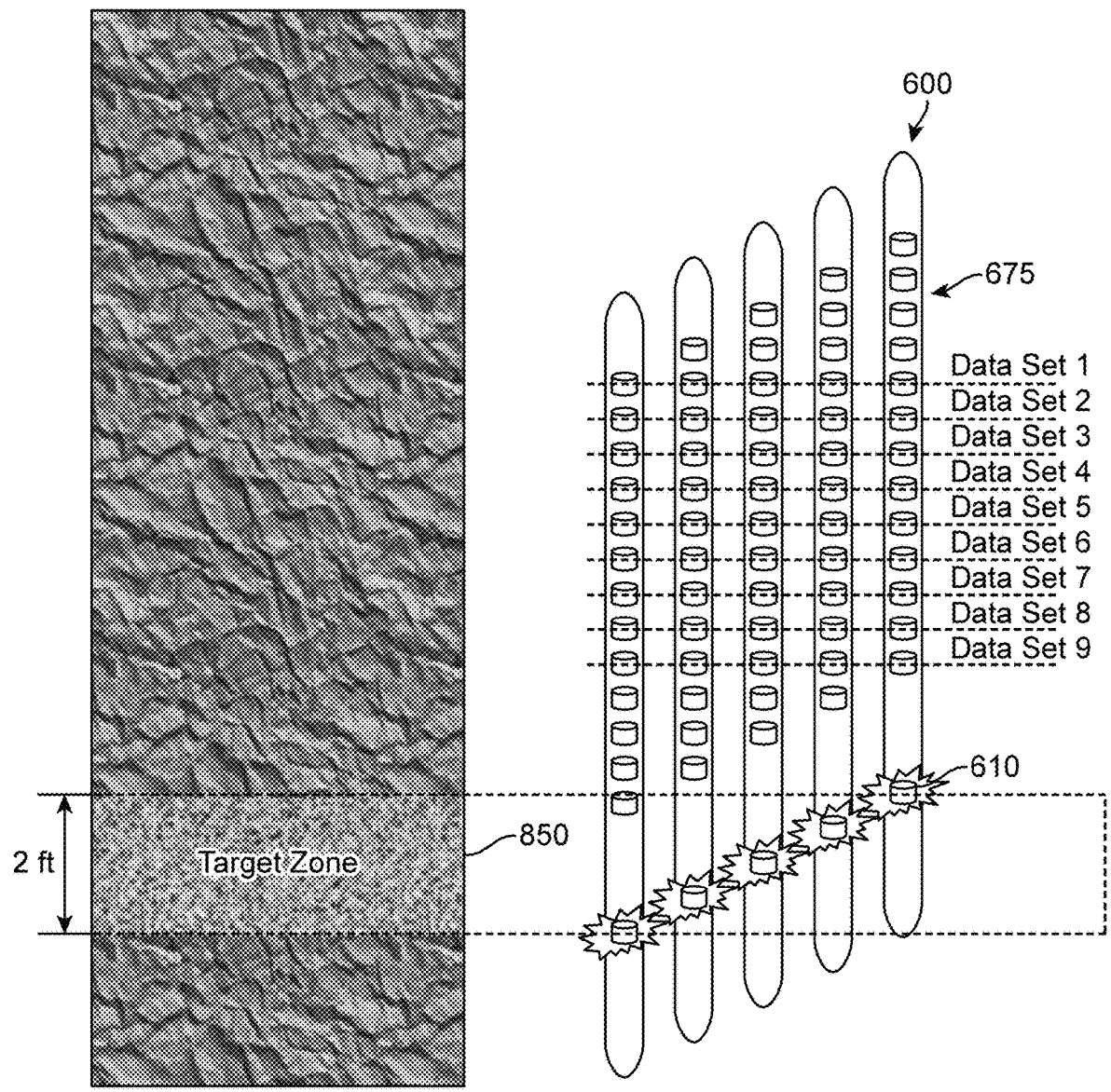
FIG. 8 illustrates a diagrammatic view of an acoustic logging tool lowered in a wellbore to collect waveforms from a target zone at a plurality of shot positions according to a common receiver gather, according to an exemplary embodiment of the present disclosure.
Figure 9E:
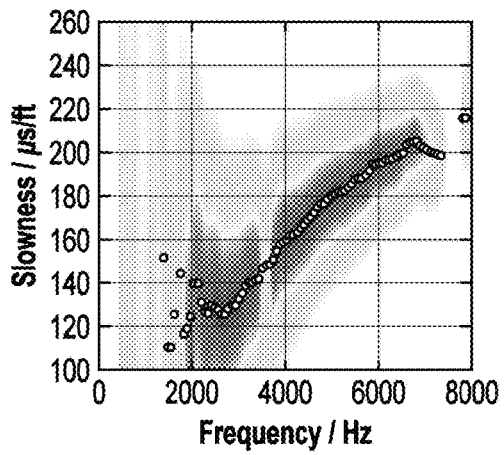
FIG. 9 is an illustration depicting semblance maps and estimated dispersion from sub-array waveform data at different shot points, according to an exemplary embodiment of the present disclosure.
Figure 9F:
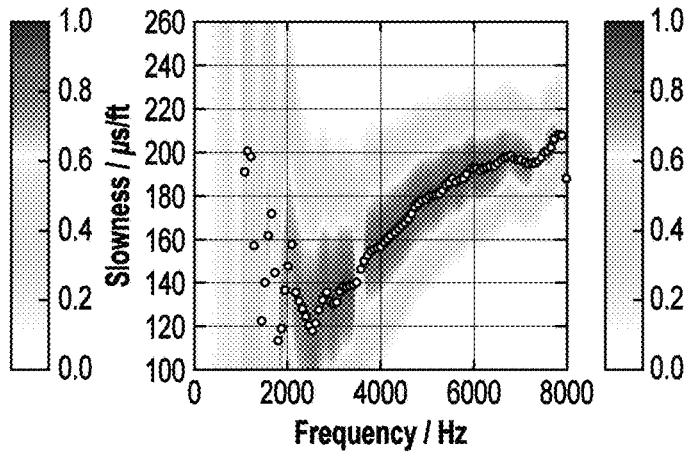
Figure 9G:
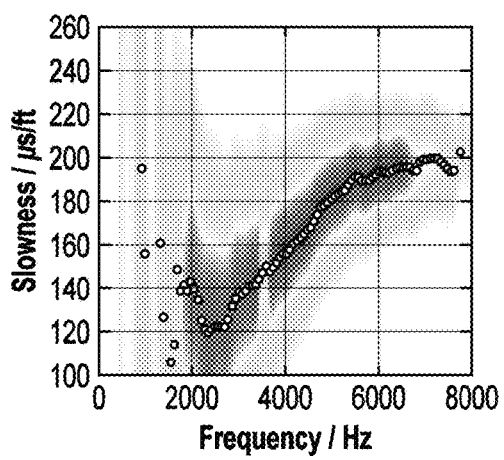
Figure 9H:
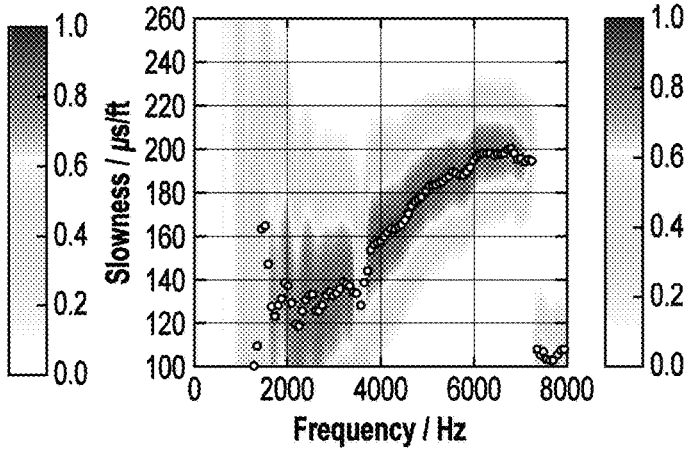
Figure 9I:
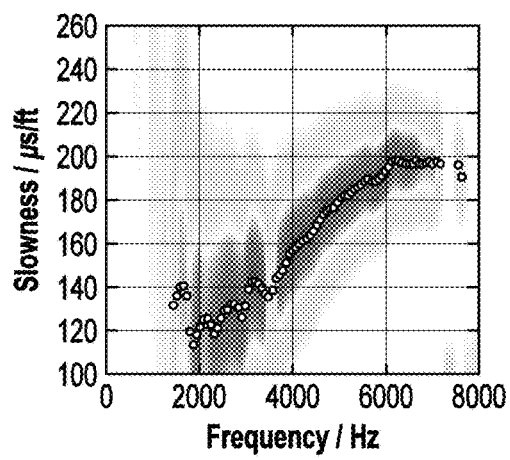

FIG. 2 illustrates a diagrammatic view of a wireline logging wellbore operating environment 200 in which the presently disclosed apparatus, method, and system, may be deployed in accordance with certain exemplary embodiments of the present disclosure. As depicted in FIG. 2, a hoist 206 may be included as a portion of a platform 202, such as that coupled to derrick 204, and used to raise or lower equipment such as wireline acoustic logging tool 210 into or out of a borehole. Acoustic logging tool 210 may include, for example, such apparatus as shown in FIGS. 6-8. A cable 242 may provide a communicative coupling between the acoustic logging tool 210 and a logging facility 244 at the surface. The logging facility 244 may include a computing device 250 capable of carrying out the methods and techniques of the present disclosure. In this manner, information about the formation 218 may be obtained by acoustic logging tool 210 and processed by a computing device, such as computing device 250.

Figure 3A:
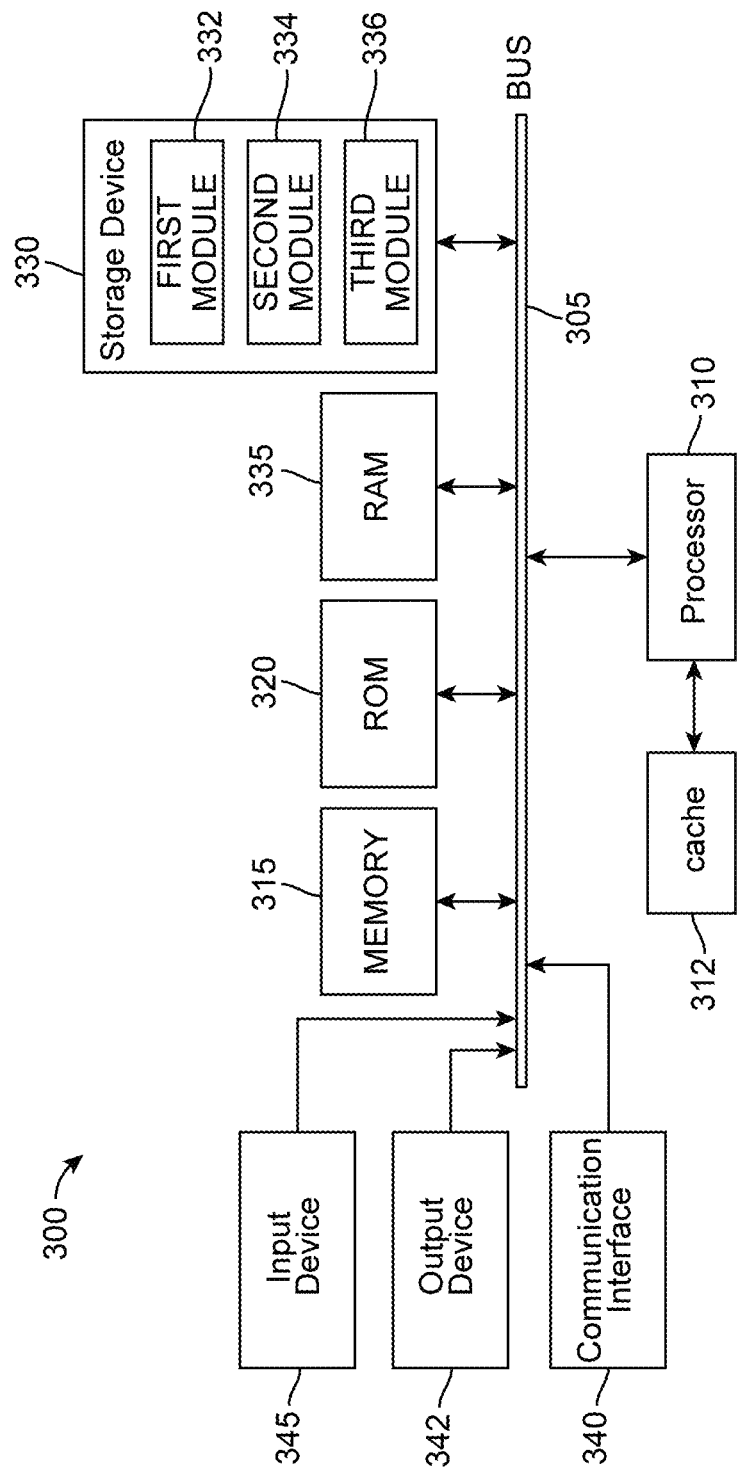
FIG. 3A is an illustration depicting a conventional system bus computing system architecture, according to an exemplary embodiment of the present disclosure.
Figure 3B:
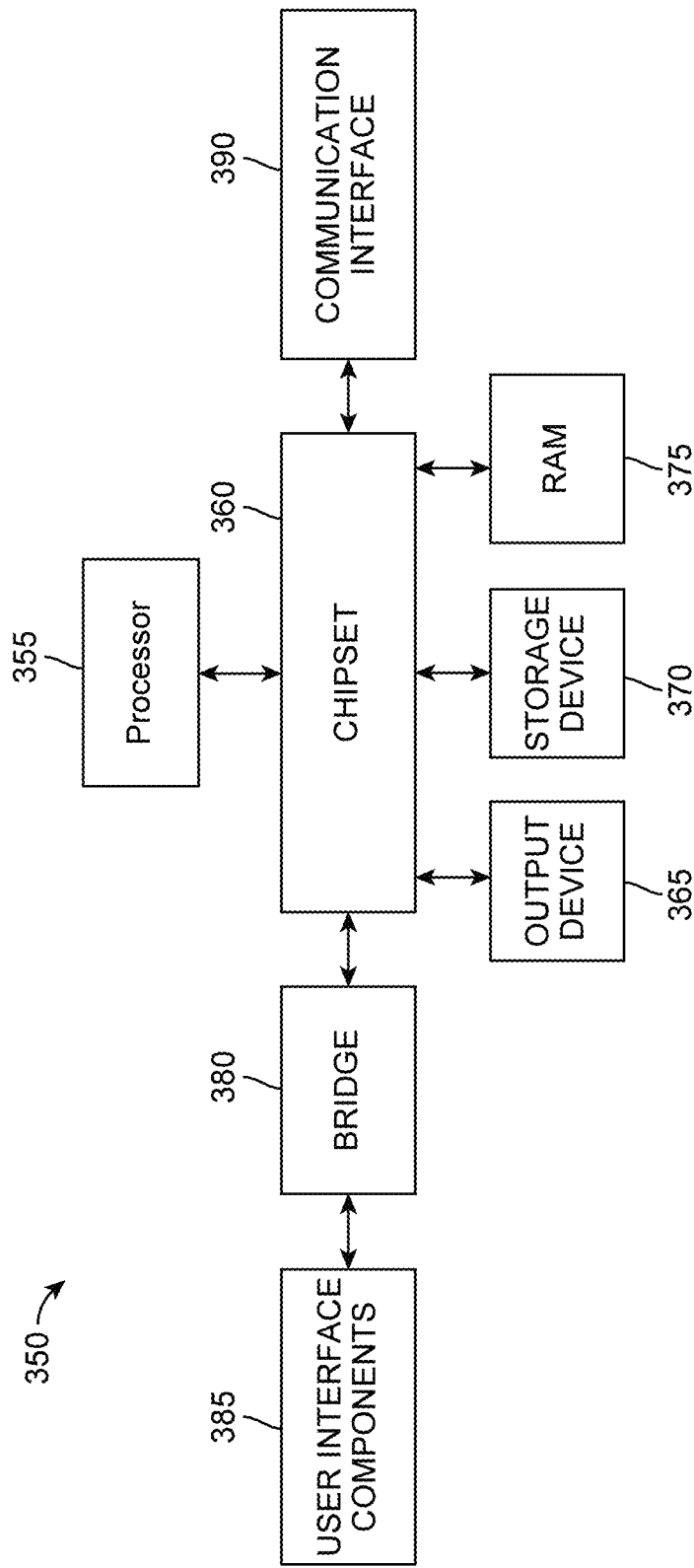
FIG. 3B is an illustration depicting a computer system having a chipset architecture, according to an exemplary embodiment of the present disclosure.

Computing devices 150 and 250 may include any suitable computer, controller, or data processing apparatus capable of being programmed to carry out the method, system, and apparatus as further described herein. FIGS. 3A and 3B illustrate exemplary computing device 150, 250 embodiments which can be employed to practice the concepts, methods, and techniques disclosed herein. The more appropriate embodiment will be apparent to those of ordinary skill in the art when practicing the present technology. Persons of ordinary skill in the art will also readily appreciate that other system embodiments are possible.

FIG. 3A illustrates a conventional system bus computing system architecture 300 wherein the components of the system are in electrical communication with each other using a bus 305. System 300 can include a processing unit (CPU or processor) 310 and a system bus 305 that couples various system components including the system memory 315, such as read only memory (ROM) 320 and random access memory (RAM) 335, to the processor 310. The system 300 can include a cache of high-speed memory connected directly with, in close proximity to, or integrated as part of the processor 310. The system 300 can copy data from the memory 315 and/or the storage device 330 to the cache 312 for quick access by the processor 310. In this way, the cache 312 can provide a performance boost that avoids processor 310 delays while waiting for data. These and other modules can control or be configured to control the processor 310 to perform various actions. Other system memory 315 may be available for use as well. The memory 315 can include multiple different types of memory with different performance characteristics. It can be appreciated that the disclosure may operate on a computing device 300 with more than one processor 310 or on a group or cluster of computing devices networked together to provide greater processing capability. The processor 310 can include any general purpose processor and a hardware module or software module, such as first module 332, second module 334, and third module 336 stored in storage device 330, configured to control the processor 310 as well as a special-purpose processor where software instructions are incorporated into the actual processor design. The processor 310 may essentially be a completely self-contained computing system, containing multiple cores or processors, a bus, memory controller, cache, etc. A multi-core processor may be symmetric or asymmetric.

The system bus 305 may be any of several types of bus structures including a memory bus or a memory controller, a peripheral bus, and a local bus using any of a variety of bus architectures. A basic input/output (BIOS) stored in ROM 320 or the like, may provide the basic routine that helps to transfer information between elements within the computing device 300, such as during start-up. The computing device 300 further includes storage devices 330 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device 330 can include software modules 332, 334, 336 for controlling the processor 310. The system 300 can include other hardware or software modules. The storage device 330 is connected to the system bus 305 by a drive interface. The drives and the associated computer-readable storage devices provide non-volatile storage of computer-readable instructions, data structures, program modules and other data for the computing device 300. In one aspect, a hardware module that performs a particular function includes the software components shorted in a tangible computer-readable storage device in connection with the necessary hardware components, such as the processor 310, bus 305, and so forth, to carry out a particular function. In the alternative, the system can use a processor and computer-readable storage device to store instructions which, when executed by the processor, cause the processor to perform operations, a method or other specific actions. The basic components and appropriate variations can be modified depending on the type of device, such as whether the device 300 is a small, handheld computing device, a desktop computer, or a computer server. When the processor 310 executes instructions to perform "operations", the processor 310 can perform the operations directly and/or facilitate, direct, or cooperate with another device or component to perform the operations.

To enable user interaction with the computing device 300, an input device 345 can represent any number of input mechanisms, such as a microphone for speech, a touch-sensitive screen for gesture or graphical input, keyboard, mouse, motion input, speech and so forth. An output device 342 can also be one or more of a number of output mechanisms known to those of skill in the art. In some instances, multimodal systems can enable a user to provide multiple types of input to communicate with the computing device 300. The communications interface 340 can generally govern and manage the user input and system output. There is no restriction on operating on any particular hardware arrangement and therefore the basic features here may easily be substituted for improved hardware or firmware arrangements as they are developed.

Storage device 330 is a non-volatile memory and can be a hard disk or other types of computer readable media which can store data that are accessible by a computer, such as magnetic cassettes, flash memory cards, solid state memory devices, digital versatile disks (DVDs), cartridges, RAMs 325, ROM 320, a cable containing a bit stream, and hybrids thereof.

The logical operations for carrying out the disclosure herein may include: (1) a sequence of computer implemented steps, operations, or procedures running on a programmable circuit with a general use computer, (2) a sequence of computer implemented steps, operations, or procedures running on a specific-use programmable circuit; and/or (3) interconnected machine modules or program engines within the programmable circuits. The system 300 shown in FIG. 3A can practice all or part of the recited methods, can be a part of the recited systems, and/or can operate according to instructions in the recited tangible computer-readable storage devices.

One or more parts of the example computing device 300, up to and including the entire computing device 300, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization computing layer can operate on top of a physical computing layer. The virtualization computing layer can include one or more of a virtual machine, an overlay network, a hypervisor, virtual switching, and any other virtualization application.

The processor 310 can include all types of processors disclosed herein, including a virtual processor. However, when referring to a virtual processor, the processor 310 includes the software components associated with executing the virtual processor in a virtualization layer and underlying hardware necessary to execute the virtualization layer. The system 300 can include a physical or virtual processor 310 that receives instructions stored in a computer-readable storage device, which causes the processor 310 to perform certain operations. When referring to a virtual processor 310, the system also includes the underlying physical hardware executing the virtual processor 310.

FIG. 3B illustrates an example computer system 350 having a chipset architecture that can be used in executing the described method and generating and displaying a graphical user interface (GUI). Computer system 350 can be computer hardware, software, and firmware that can be used to implement the disclosed technology. System 350 can include a processor 355, representative of any number of physically and/or logically distinct resources capable of executing software, firmware, and hardware configured to perform identified computations. Processor 355 can communicate with a chipset 360 that can control input to and output from processor 355. Chipset 360 can output information to output device 365, such as a display, and can read and write information to storage device 370, which can include magnetic media, and solid state media. Chipset 360 can also read data from and write data to RAM 375. A bridge 380 for interfacing with a variety of user interface components 385 can include a keyboard, a microphone, touch detection and processing circuitry, a pointing device, such as a mouse, and so on. In general, inputs to system 350 can come from any of a variety of sources, machine generated and/or human generated.

Chipset 360 can also interface with one or more communication interfaces 390 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 355 analyzing data stored in storage 370 or RAM 375. Further, the machine can receive inputs from a user via user interface components 385 and execute appropriate functions, such as browsing functions by interpreting these inputs using processor 355.

It can be appreciated that systems 300 and 350 can have more than one processor 310, 355 or be part of a group or cluster of computing devices networked together to provide processing capability. For example, the processor 310, 355 can include multiple processors, such as a system having multiple, physically separate processors in different sockets, or a system having multiple processor cores on a single physical chip. Similarly, the processor 310 can include multiple distributed processors located in multiple separate computing devices, but working together such as via a communications network. Multiple processors or processor cores can share resources such as memory 315 or the cache 312, or can operate using independent resources. The processor 310 can include one or more of a state machine, an application specific integrated circuit (ASIC), or a programmable gate array (PGA) including a field PGA.

Methods according to the aforementioned description can be implemented using computer-executable instructions that are stored or otherwise available from computer readable media. Such instructions can comprise instructions and data which cause or otherwise configure a general purpose computer, special purpose computer, or special purpose processing device to perform a certain function or group of functions. Portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with nonvolatile memory, networked storage devices, and so on.

For clarity of explanation, in some instances the present technology may be presented as including individual functional blocks including functional blocks comprising devices, device components, steps or routines in a method embodied in software, or combinations of hardware and software. The functions these blocks represent may be provided through the use of either shared or dedicated hardware, including, but not limited to, hardware capable of executing software and hardware, such as a processor 310, that is purpose-built to operate as an equivalent to software executing on a general purpose processor. For example, the functions of one or more processors represented in FIG. 3A may be provided by a single shared processor or multiple processors. (use of the term "processor" should not be construed to refer exclusively to hardware capable of executing software.) Illustrative embodiments may include microprocessor and/or digital signal processor (DSP) hardware, ROM 320 for storing software performing the operations described below, and RAM 335 for storing results. Very large scale integration (VLSI) hardware embodiments, as well as custom VLSI circuitry in combination with a general purpose DSP circuit, may also be provided.

The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing methods according to these disclosures can comprise hardware, firmware and/or software, and can take any of a variety of form factors. Such form factors can include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device.

The instructions, media for conveying such instructions, computing resources for executing them, and other structures for supporting such computing resources are means for providing the functions described in the present disclosure.

Figure 4:
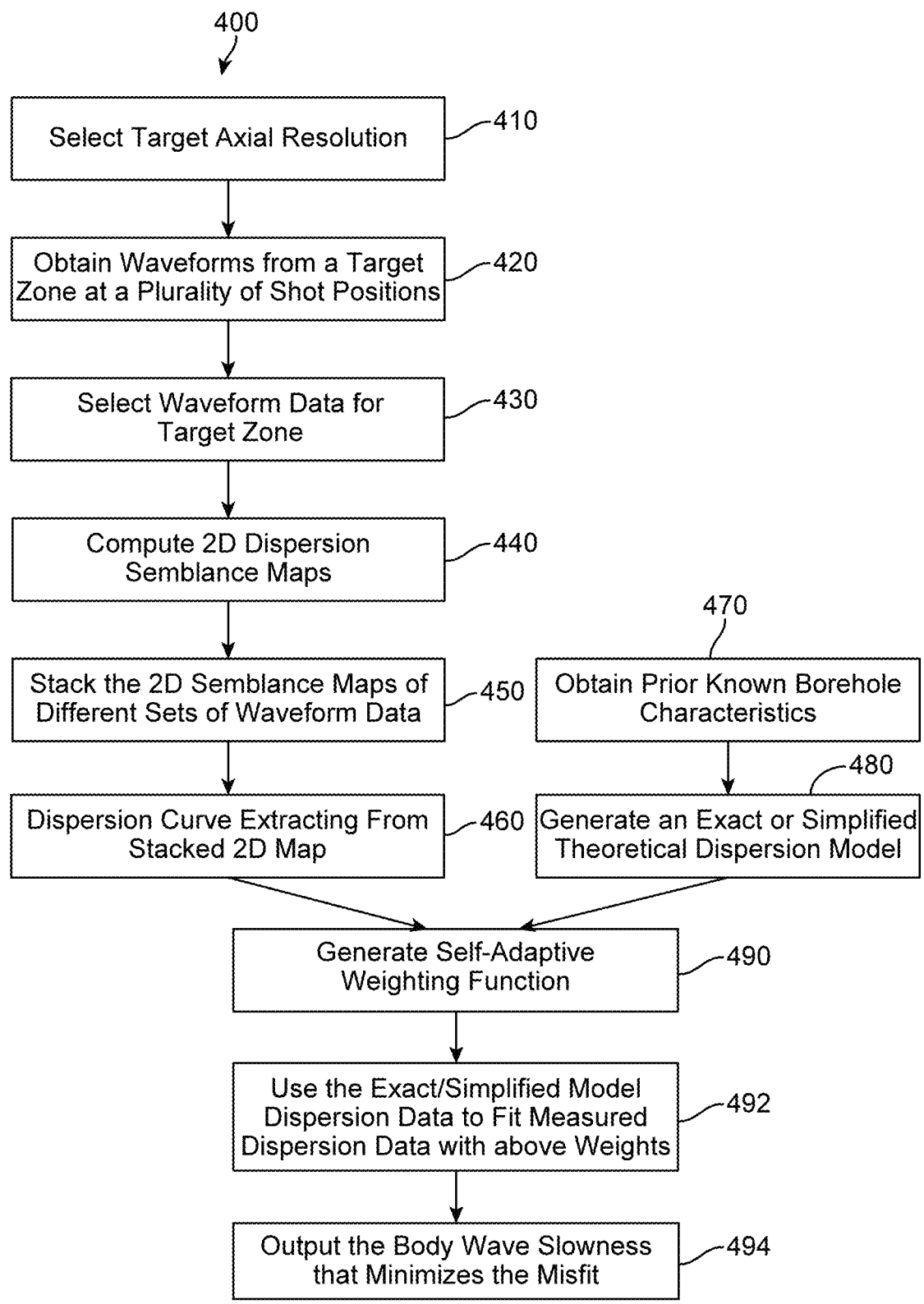
FIG. 4 illustrates a flowchart depicting a method of enhanced-resolution data processing in the frequency-domain, according to an exemplary embodiment of the present disclosure.

FIG. 4 illustrates a flowchart depicting a method 400 of enhanced-resolution data processing in the frequency-domain, in accordance with certain exemplary embodiments of the present disclosure. The method shown in FIG. 4 is provided by way of an example, as there are a variety of ways to carry out the method. Each block shown in FIG. 4 represents one or more processes, methods, or subroutines, carried out in the exemplary method shown in FIG. 4. Furthermore, the illustrated order of blocks is illustrative only as according to the certain aspects of the present disclosure, the order of the blocks may change. Additional blocks can be added or fewer blocks can be utilized, without departing from the present disclosure.

The exemplary method 400 can begin at block 410. At block 410, a target axial resolution is selected based on the size of the receiver array. At block 420, several sets of waveforms are collected for a target formation zone with the same array size but at different shot positions. At block 430, all of the waveform data that corresponds to the target formations are selected. Slowness-frequency 2D dispersion semblance maps are computed for each set of waveform data at block 440. At block 450, the 2D semblance maps that cover the same target formation zone are stacked together to produce an enhanced or stacked 2D semblance map. The data processing represented by blocks 410-450 decreases the influence of noise by utilizing a large amount of redundant data. After stacking to produce the enhanced or stacked 2D semblance map (block 450), guide wave dispersion responses may be extracted from the stacked 2D semblance map by picking the semblance peaks at each frequency, as depicted at block 460.

Prior known borehole characteristics, such as borehole fluid types, borehole diameter, formation density, and compressional slowness from previous measurements, are obtained at block 470. At block 480, either an exact or simplified theoretical borehole dispersion model is generated based on the prior known borehole characteristics, which will be used to generate a self-adaptive weighting function at block 490 and to fit the measurements at block 492. The exact dispersion model refers to forward modeling based methods, while the simplified dispersion model that introduced adjustable parameters is always utilized in data-driven methods.

Following the obtaining the dispersion measurements from the enhanced dispersion map, at block 460, and generating the dispersion model curves of the forward modeling, at block 480, the modeling dispersions are fit with the measured dispersions at block 492 to construct a self-adaptive weighting function. Before the fitting procedure at block 492, a self-adaptive weighting function may be generated at 490 applied to the frequency domain data, to enhance the weighted portion of the data that have a good SNR and require a minimum dispersion correction. At block 492, an inversion procedure may be used to minimize the differences between the dispersion model and the weighted measurements. Finally, at block 494, the body wave slowness that is able to minimize the misfit between model and measurements is outputted as improved slowness answers.

Figure 5:
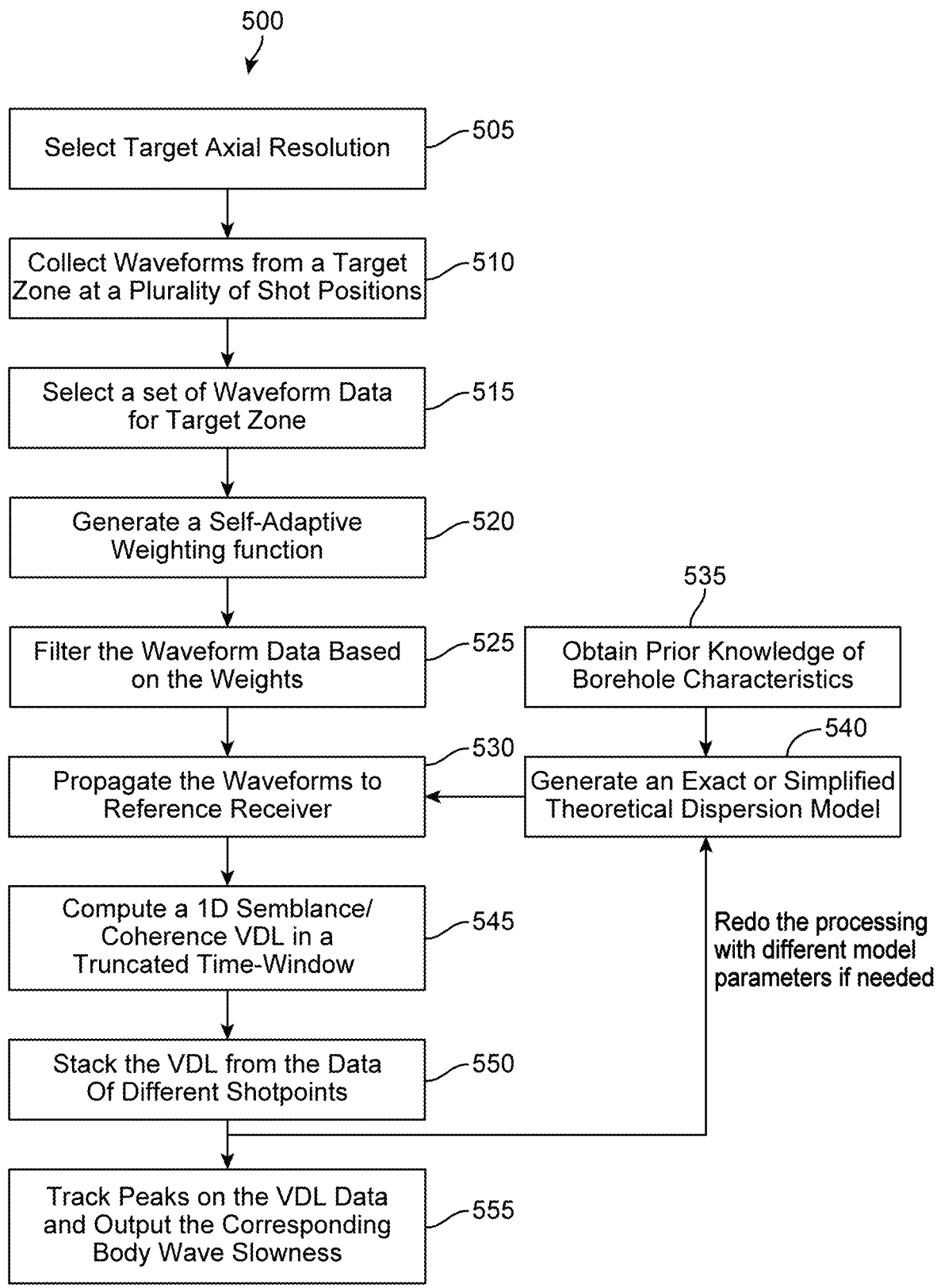
FIG. 5 illustrates a flowchart depicting a method of enhanced waveform data processing in the time-domain, accordance to an exemplary embodiment of the present disclosure.

FIG. 5 illustrates a flowchart depicting a method 500 of enhanced waveform data processing in the time-domain, in accordance with certain exemplary embodiments of the present disclosure. The method shown in FIG. 5 is provided by way of an example, as there are a variety of ways to carry out the method. Each block shown in FIG. 5 represents one or more processes, methods, or subroutines, carried out in the exemplary method shown in FIG. 5. Furthermore, the illustrated order of blocks is illustrative only as according to the certain aspects of the present disclosure, the order of the blocks may change. Additional blocks can be added or fewer blocks can be utilized, without departing from the present disclosure.

The exemplary method 500 can begin at block 505. At block 505, a target axial resolution is selected based on the size of the receiver array. At block 510, a plurality of sets of waveforms are collected for a target formation zone with the same array size but at different shot positions. At block 515, all of the waveform data that corresponds to the target formations are selected. A self-adaptive weight function is generated at block 520 to enhance the desired portion of the data in the waveforms. At block 525, the waveform data is filtered based on the weights by reconstructing the amplitude part of the waveform with weights and filtering the waveforms in order to enhance the SNR of the data and minimize dispersion correction.

The filtered waveforms are inputted to a time-domain semblance computation at block 530. In order to perform the time-domain semblance computing, an exact or simplified dispersion model is generated at block 540, based on prior knowledge of borehole characteristics, obtained at block 535. The dispersion model generated at block 540 is utilized to propagate the waveforms to different receivers at block 530.

The waveform is truncated and the semblance/coherence value of all the waveforms at a reference receiver that are propagated from different receivers is computed at block 530. Performing the procedure of block 530 for different slowness values allows for the computation, at block 545, of semblance/coherence value versus slowness, or a 1D semblance/coherence VDL in a truncated time-window. Performing the processing with the waveform data for the same target formation zone but at different shot positions allows for the computation of a set of 1D VDLs for the current zone. At block 550, all the VDLs for the current zone are stacked to obtain an enhanced VDL having an improved SNR.

If the model contains adjustable parameters, blocks 530 to 550 may be performed again with different parameter values to minimize the misfit between modeling and measurements. At block 555, peaks on the VDL data are tracked and the corresponding body wave slowness is output. The adjustable parameters, if used, may also be output. In contrast to the frequency processing method 400 described in FIG. 4, the time domain processing method 500 introduces a time-window to truncate part of the waveforms, thus helping to remove the influence of noise or scattering wave motions outside of the time-window.

FIG. 6 illustrates a diagrammatic view of an acoustic logging tool 600 capable of performing the presently disclosed methods and techniques in accordance with certain exemplary embodiments of the present disclosure. As depicted in FIG. 6, the acoustic logging tool 600 includes at least one transmitter 610 capable of exciting acoustic signals of different azimuthal orders. Acoustic logging tool 600 further includes a large-span receiver array comprising thirteen receivers 620-632 with a spacing 640 of 0.5 feet, similar to the Xaminer® Array Sonic Tool (XAST), available from Halliburton Energy Services, Inc. The large-span receiver array is capable of capturing an acoustic wave field of different azimuthal orders. In such an acoustic logging tool 600, the axial resolution of slowness logs can vary with different sub-array processings. Generally, the axial resolution of an extracted slowness curve is between the receiver to receiver spacing and the array size, which may be from about 0.5 feet to about 6 feet, depending on the size of the sub array.

As depicted in the method 400 of FIG. 4, block 410 involves determining the target axial resolution at, for example, a signal processor. Subsequently, the size of the receiver array can be calculated by the following equation:

$$L=\lfloor Res/RR+1 \rfloor, \qquad \text{Eqn. 1}$$

where L denotes the size of the sub-array, Res represents the target resolution, an RR denotes the receiver-receiver space.

FIG. 7 illustrates a diagrammatic view of acoustic logging tool 600 lowered in a wellbore to collect waveforms from a target zone at a plurality of shot positions according to a common transmitter gather, in accordance with certain exemplary embodiments of the present disclosure. As depicted in FIG. 7, the acoustic logging tool 600 may be lowered to a depth in the borehole corresponding to a target zone of interest 750 followed by causing the transmitter to fire and capturing acoustic signals at the receiver array 675. The acoustic logging tool 600 may be repositioned in the wellbore a plurality of times in order to collect waveform data at the receiver array 675 for the same target zone 750 but with different shot positions 1-9. In this manner, abundant data for evaluating the target zone of interest 750 may be collected. For example, the transmitter array depicted in FIG. 7 may have an axial resolution of 2 feet. A 2 foot axial resolution requires a sub-array size having 5 receivers when RR=0.5 feet. Assuming the data is acquired at an equally spaced firing of 0.5 feet with the moving transmitter, FIG. 7 shows that data sorting at each firing covers the same target zone 750. As depicted in FIG. 7, at shot 1, waveform data at receivers 628-632 meet the sorting requirements, and for shot 2, receivers 627-631 meet the sorting requirements. In total, acoustic logging tool 600 can acquire nine sets or 9×5 sets of waveforms, which greatly exceeds that used in fully-array processing that uses only thirteen receiver waveforms. As depicted in FIG. 7, all sets of selected waveform data cover the same target zone 750, the same investigating depth, and the same axial resolution. Consequently, it is feasible to combine the processing of all sets of waveform data together in order to obtain a unique and reliable slowness/dispersion answer.

FIG. 8 illustrates a diagrammatic view of acoustic logging tool 600 lowered in a wellbore to collect waveforms from a target zone at a plurality of shot positions according to a common receiver gather, in accordance with certain exemplary embodiments of the present disclosure. As depicted in FIG. 8, waveforms may be selected that share the same receiving zone but have different shot positions while making sure that the shot positions of the waveforms align with the target formation zone. As shown in FIG. 8, nine sets of waveform data are obtained, with each set containing five waveforms with receivers corresponding to the target zone. Combining the processing of common transmitter sub-array and common receiver sub-array allows for calibration of the influence of borehole radius changes and provides for the correction of tool tilt. The two types of array share exactly the same processing steps.

According to the present disclosure, waveform data from different shot positions may be combined. Generally, the sub-array data from different shot positions can be considered as "repeated measurements" of the same target zone with different sets of receivers. The "repeated measurements" may be averaged to improve SNR. In guided wave analysis, the waveform data may be fed into a dispersion analysis program and a semblance/coherence map may be generated by the program. For example, a program may use differential phase frequency semblance (DPFS), $$\phi(f,s) = \tan^{-1}\left[\frac{\frac{1}{\sum_{k=1}^{N-1}(N-k)}\sum_{i=1}^{N-1}\sum_{j=1}^{N-1}\text{real}\,(Y_i(f,s)*Y_{i+j}^*(f,s))}{\frac{1}{\sum_{k=1}^{N-1}(N-k)}\sum_{i=1}^{N-1}\sum_{j=1}^{N-1}\text{imag}(Y_i(f,s)*Y_{i+j}^*,(f,s))}\right], \quad \text{Eqn. 2}$$

where $\phi(f,s)$ is the frequency phase difference value at each frequency f and slowness s, $Y^*(f,s)$ is the complex conjugate of $Y(f,s)$, and real and imag are the real and imaginary parts of a complex number, when processes receivers 1 to N. The 2D semblance map may be obtained from the frequency phase difference value with the equation of $\text{Semb}(f,s)=\max(1-2\phi(f,s)/\pi,0)$. Tracking the peaks on the map at different frequencies yields the dispersion responses, in the form of slowness versus frequency.

Herein, there are several sets of sub-array data which measure the properties of the same formation zone. All of the data in the frequency-domain processing may be combined by taking the average of the dispersion response. However, this approach may not work well if the dispersion response is noisy at some frequencies. In such cases, the centroid of the dispersion response may be incorrect. A better approach is to first decrease the noise level of the 2D semblance map according to the methods of the present disclosure. In particular, the present disclosure provides a method to improve the 2D map by stacking all of the sub array 2D maps together, $$\text{Semb}^*(f,s)=\Sigma_{i=1}^M\text{Semb}_i(f,s), \quad \text{Eqn. 3}$$

or, we could use a weight to minimize the contribution of low quality data, $$\text{Semb}^*(f,s)=\Sigma_{i=1}^M\text{Weight}(i)*\text{Semb}_i(f,s). \quad \text{Eqn. 4}$$

Figure 10:
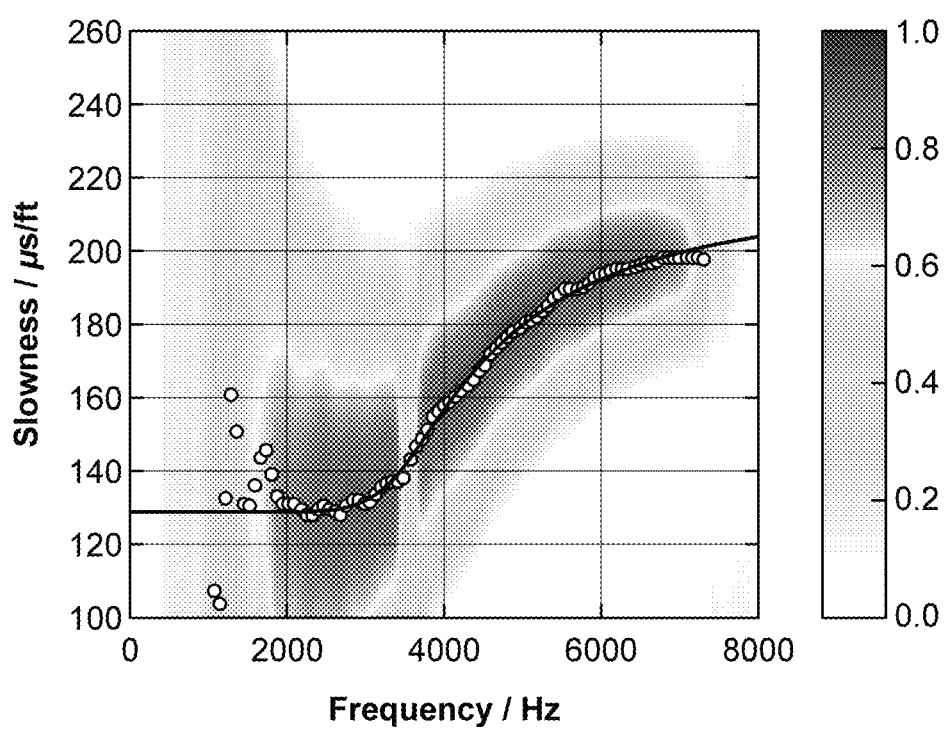
FIG. 10 is an illustration depicting a stacked semblance map from the data shown in FIG. 9 and an estimated dispersion from the map, according to an exemplary embodiment of the present disclosure.

FIGS. 9 and 10 illustrate an example of the 2D map stacking method with dispersion processing of flexural waves, in accordance with certain exemplary embodiments of the present disclosure. FIG. 9A-I depicts the 2D maps from shot positions 1-9 in FIG. 7, respectively. The results indicate that for sub-array data both the 2D maps and estimated dispersions are noisy and unstable at low-frequencies when the flexural wave slowness start to approach the formation shear slowness. This fact makes the estimated low-frequency data have large uncertainty, and result in lower-accuracy slowness estimates. FIG. 10 depicts the stacked 2D maps shown in FIG. 9A-I. As depicted in FIG. 10, the utilization of the redundant data, according to the methods of the present disclosure, suppresses the noise level thereby allowing a clear and converged 2D map to be obtained. In addition, the low-frequency semblance qualities are improved, and the estimated dispersions are converged to the formation shear slowness. FIG. 10 also shows that the present methods identifies shear slowness by matching the whole dispersion responses.

While the above examples are described with respect to frequency-domain processing, the same procedures apply equally to the time-domain processing methods of the present disclosure. In time-domain borehole guided processing, a 1D semblance map along the axis of slowness is produced. A lower-noise semblance map may be obtained by stacking the 1D semblance maps of different sets of array waveforms.

As previously described, two types of forward modeling methods can be utilized in borehole guide wave processing. One method is the exact model, which corresponds to a modeled-based processing method, and the other is a data-driven simplified model with adjustable parameters, which can be referred to as a data-driven processing approach. The methods and techniques of the present disclosure are suitable for use with either the modeling-based or data-driven approaches.

After selecting the forward model, a data fitting/optimization step may be performed between the modeling result and measurements in order to generate the final slowness answer. In some cases, the data quality may not be good enough even after the semblance map stacking step is performed. In order to further improve the fitting, the present disclosure provides a method to generate and apply a self-adapting weighting function to the data. The weighting function generates different weights at different frequency in order to optimize the fitting processing. The weighting function can be changed for different purposes according to the characteristics of the guided waves.

For example, in the case of estimating body wave slowness from borehole guided waves, there are two important factors that need to be considered. One factor is the need to assign more weight to preferred data due to the favorable signal-to-noise-ratio (SNR) of that data. The second consideration is that the slowness value of the preferred data should be close to the true shear slowness value so that only a little dispersion correction is required.

Figure 11:
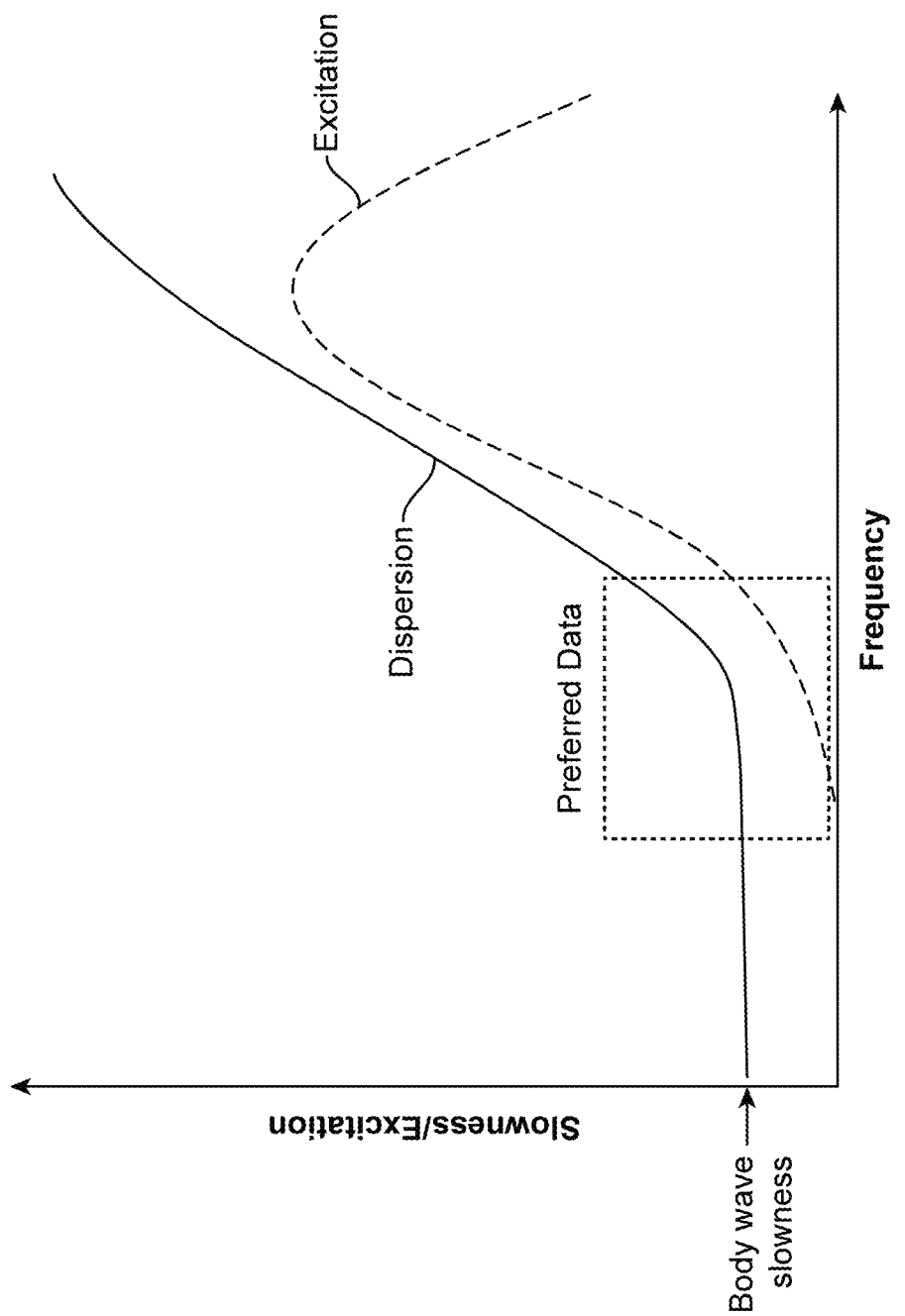
FIG. 11 illustrates preferred frequencies in general guided wave processing for estimating body wave slowness from a typical borehole guided wave dispersion and excitation, according to an exemplary embodiment of the present disclosure.

FIG. 11 illustrates preferred frequencies in general guided wave processing for estimating body wave slowness from a typical borehole guided wave dispersion and excitation, in accordance with certain exemplary embodiments of the present disclosure. The guided wave slowness starts to differ from the body wave slowness at a specific frequency, which is known in the industry as the "cutoff-frequency." The excitation amplitude reaches a maximum at the Airy-phase frequency, and decreases to zero at the "cutoff frequency." As depicted in FIG. 11, only the data sets at the frequencies near the "cut-off frequency," as indicated by the dashed square in FIG. 11, have certain excitation amplitude and require a low dispersion correction. Consequently, it is preferred that those data be associated with higher weights in the inversion. There are several methods that may be used to generate an adaptive weighting function to enhance the contribution of preferred data in the data processing method.

As depicted in FIG. 11, the dispersion curve becomes gentle and flat as the frequency approaches the "cut-off frequency." In the VDL display of the dispersion distributed, the flat parts of the dispersion responses often form peaks or edges in the VDL. The VDLs may be used to monitor the quality of the correct picks of body wave slowness. The methods and techniques of the present disclosure utilizes such VDLs for constructing a weight function to increase the weights on an "almost flat" part of the data curve. It is possible to use different VDL display methods in this approach. Below we show an example of using normalized slowness density logs. The normalized slowness density log may be computed by the following equation:

$$NSDL(s) = \exp\left(-\min\left\{\frac{\max(1, n_f a)}{\left[\sum_{f=f_1}^{f=f_{max}} Coh(s, f)\right]^2}, \frac{\text{length } [Coh(s, f) > 0]}{\sum_{f=f_1}^{f=f_{max}} Coh(s, f)}\right\}\right)$$ Eqn. 5 where $f_{max}$ denotes the maximum frequency range to be considered and length[Coh(s,f)>0] denotes the number of frequency points with coherence values larger than 0, and $\sum_{f=f_1}^{f=f_{max}}$ Coh(s,f) denotes the summation of all the coherence values along the frequency axis for a specific slowness s, $n_f$ is the number of frequency points between $f_{max}$ and $f_1$, and a is an empirically adjustable parameter.

In the weighting function, the domain argument is frequency. Therefore, the normalized slowness density log may be projected to frequency by the projecting equation, $$NSDL(f)=NSDL[s(f)]$$ Eqn. 6 where s(f) denotes the measured dispersion curve.

Figure 12:
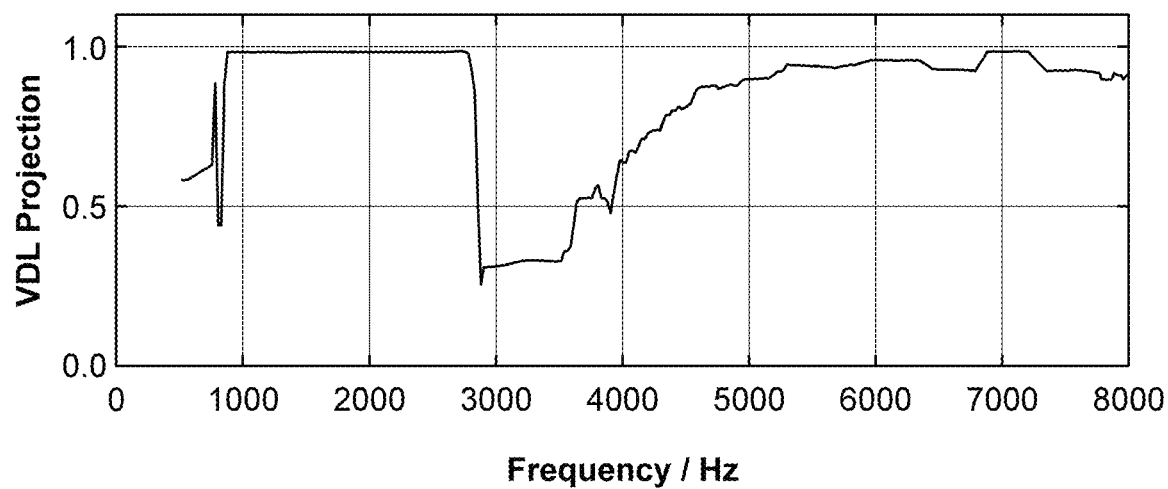
FIG. 12 illustrates a normalized slowness density log projected to the frequency axis, according to an exemplary embodiment of the present disclosure.

FIG. 12 illustrates a normalized slowness density log projected to the frequency axis, in accordance with certain exemplary embodiments of the present disclosure. As depicted in FIG. 12, it is clear that the data sets that are near the cut-off frequencies are highly enhanced by the weights. Another aspect of the inversion is that the signal of high energy should be more reliable than the signals of low energy. Therefore, weights can also be assigned according to the average amplitude of the target waveform data at different receivers, $$AMP(f) = \frac{\sum_{i=1}^{M}\sum_{j=1}^{N} AMP_i^j(f)}{\max\left[\sum_{i=1}^{M}\sum_{j=1}^{N} AMP_i^j(f)\right]}$$ Eqn. 7 where N is the size of sub array, M is the number of shots.

Figure 13:
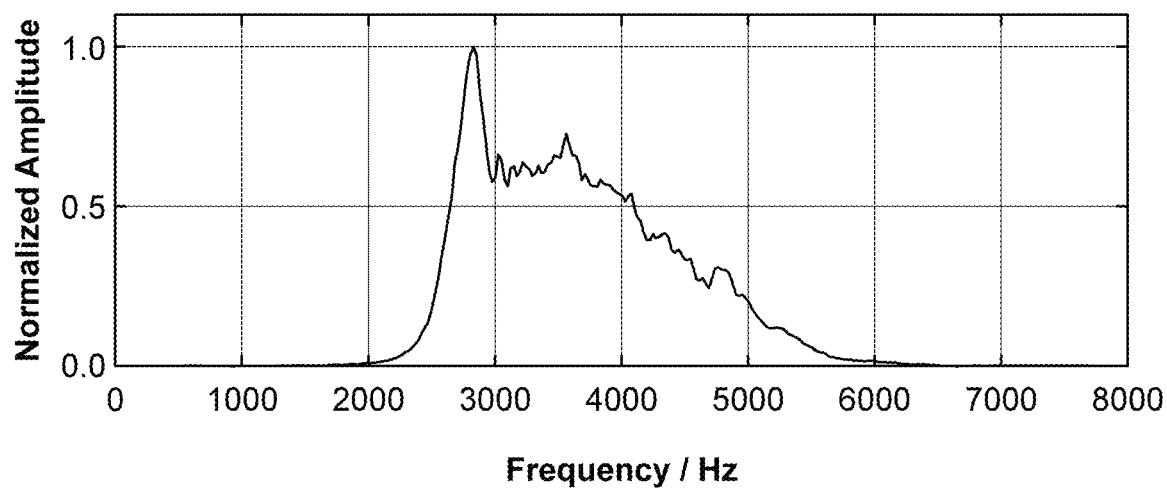
FIG. 13 illustrates an average amplitude curve from the waveform data, according to an exemplary embodiment of the present disclosure.

For example, FIG. 13 illustrates an average amplitude curve from the waveform data, in accordance with certain exemplary embodiments of the present disclosure. As depicted in FIG. 13, the averaged waveform spectrum has a relatively wide excitation band width, as it drops down to zeros at cut-off frequencies. FIG. 13 further demonstrates that the amplitude weights can be used to assess the reliability of the data at low-frequencies.

In order to combine the slowness density projection weights and amplitude weights, the following equation may be used, $$Weight(f)=NSDL^{b1}(f)*AMP^{b2}(f).$$ Eqn. 8

Furthermore, in order to decrease the influence from high-frequency asymptotes of the data, the weights of high-frequency data may be reduced according to the following equation, $$Weight(f) = \frac{Weight(f) Weight_{highMax}}{\max[Weight(f)]}, f > f_{|Ref}.$$ Eqn. 9

The parameter $f_{|Ref}$ can be determined by an optimized high frequency limit selection method. The parameter $Weight_{highMax}$ is the adjusted weight maximum for high-frequency data.

Figure 14:
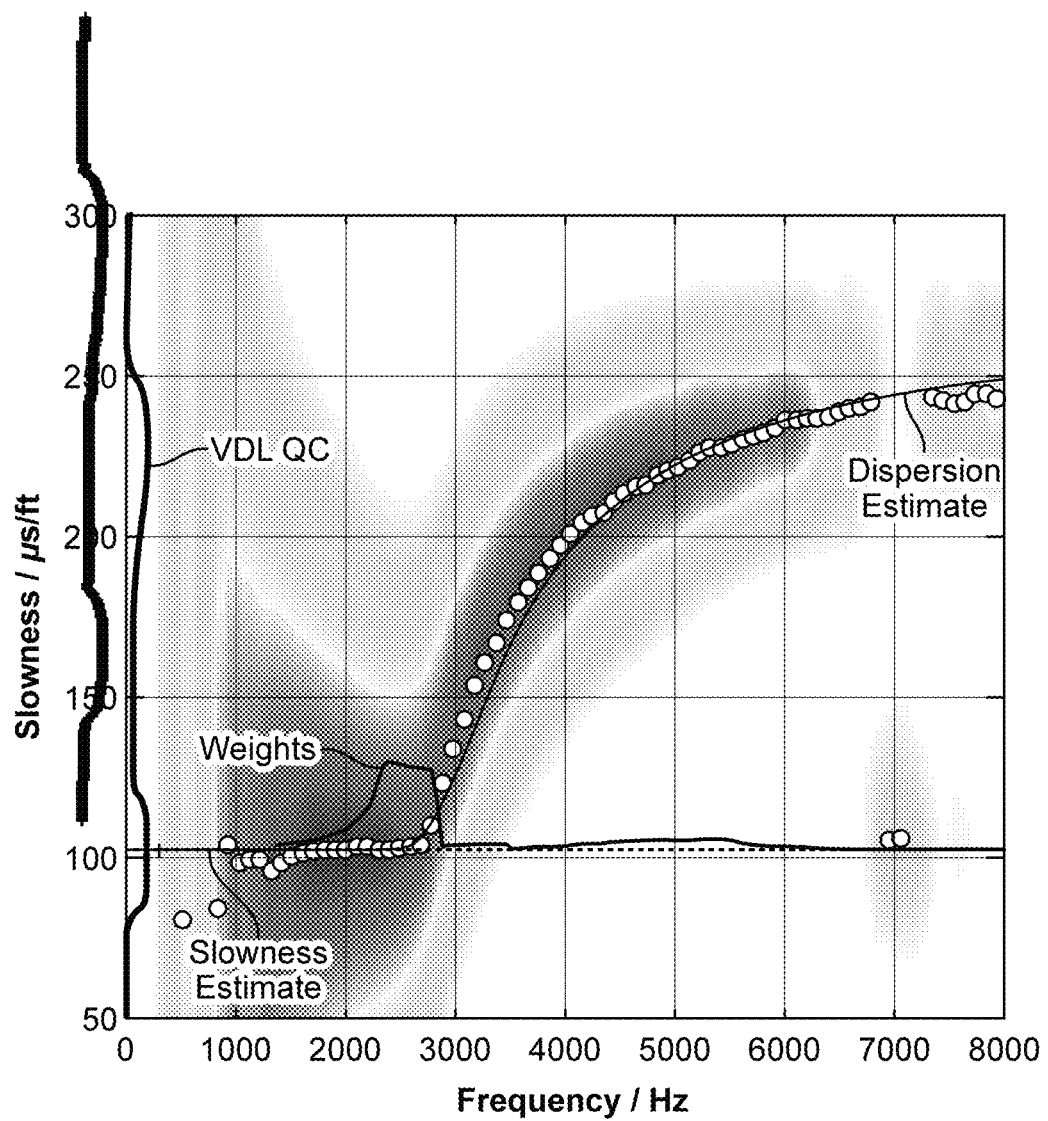
FIG. 14 illustrates a dispersion map, constructed weights and processing results for slowness estimates according to the presently disclosed methods and techniques, according to an exemplary embodiment of the present disclosure.

FIG. 14 illustrates a dispersion map, constructed weights and processing results for slowness estimates according to the presently disclosed methods and techniques, in accordance with certain exemplary embodiments of the present disclosure. As depicted in FIG. 14, it is evident that the weights generated according to Eqn. 9, enhances the preferred data to produce a slowness answer that matches the measurement. Additionally, FIG. 14 shows that at low frequencies, the data that are close to the cut-off frequency have high weights, while the data far below the cut-off frequency jump around formation shear slowness values due to low excitation amplitudes associated with either zero assigned weights or low assigned weights. Such weight characteristics make the slowness inversion stable and more reliable, thereby producing a more accurate formation body wave slowness answer. The self-adaptive weighting function described herein may also be used in full-array processing to further enhance the processing results.

Figure 15:
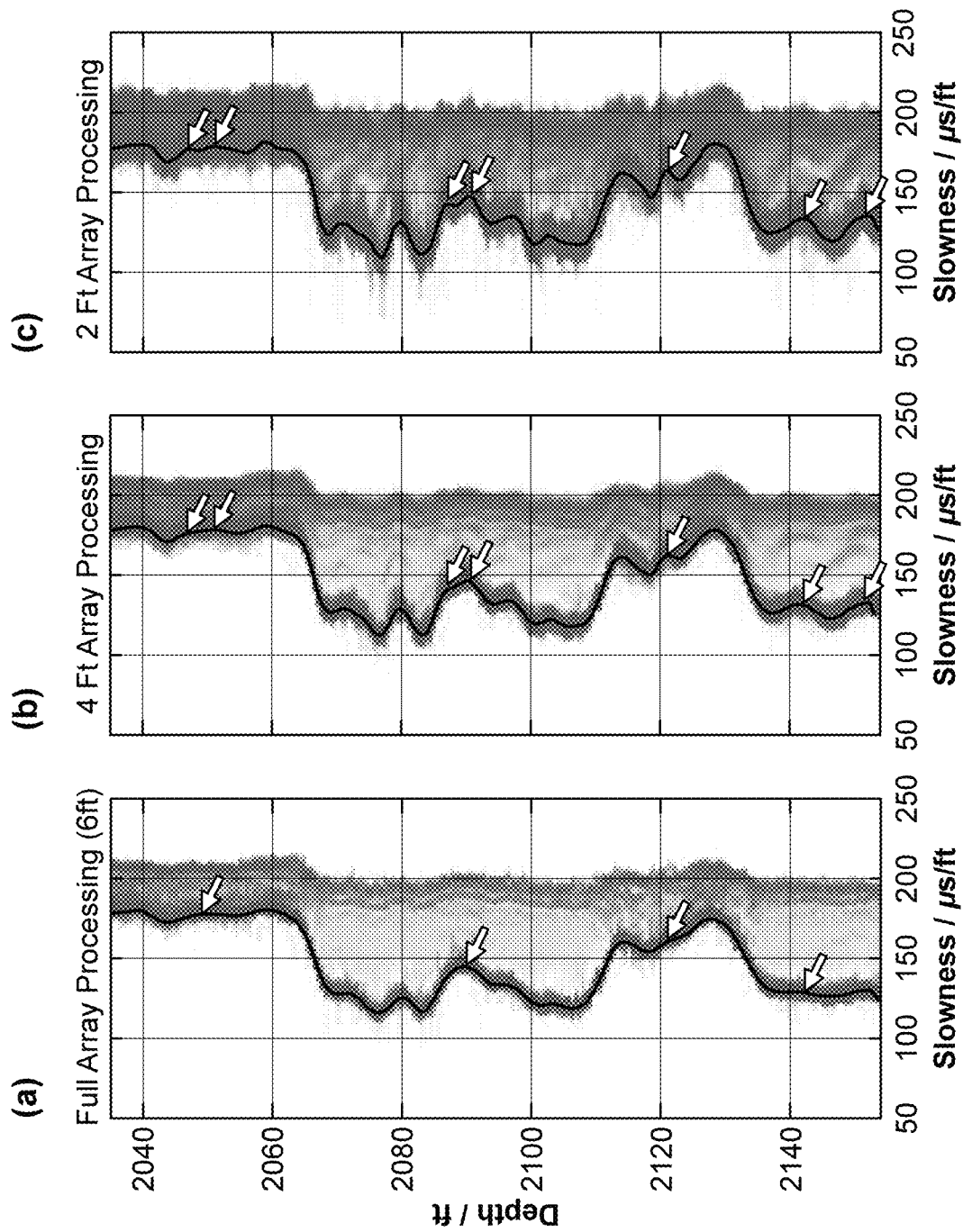
FIG. 15 illustrates processing results according to the presently disclosure methods and techniques, for realistic field data obtained using a sub array having a two foot, four foot, and six foot axial resolution, according to an exemplary embodiment of the present disclosure.

FIG. 15 illustrates processing results according to the presently disclosure methods and techniques, for realistic field data obtained using a sub array having a two foot, four foot, and six foot axial resolution, in accordance with certain exemplary embodiments of the present disclosure. FIG. 15A depicts the processing results of a full 13-receiver array with an axial resolution of 6 feet. FIG. 15B depicts the processing results of a 9-receiver array with an axial resolution of 4 feet. FIG. 15C depicts the processing results of a 5-receiver array with an axial resolution of 2 feet.

All three slowness logs depicted in FIG. 15 are stable, smooth, and in agreement in terms of accuracy. Additional details and minor formation changes are observed in both the VDL maps and shear slowness estimates for the 2 feet axial resolution results as compared to the 6 feet axial resolution. For example, around a depth of 2050 m, the full array processing yields a single layer, while the 2 feet axial resolution processing shows two layers and minor slowness changes. A similar phenomenon can be observed at other depths, for instance, at depths 2090 m, 2122 m, and 2143 m. More importantly, the sub-array processing decreases the influence of neighboring rocks, and consequently, the body wave estimates in the thinner layer, thereby demonstrating that the presently disclosed methods and techniques provide more accurate results as compared with conventional full array processing.

Statements of the Disclosure Include:

Statement 1: A method of determining body wave slowness from guided borehole waves, the method comprising: selecting a target axial resolution based on the size of a receiver array; obtaining a plurality of waveform data sets corresponding to a target formation zone, wherein each waveform data set is acquired at a different shot position; computing a slowness-frequency 2D dispersion semblance map for each waveform data set; stacking the slowness-frequency 2D dispersion semblance maps to generate a stacked 2D semblance map; extracting a dispersion curve from the stacked 2D semblance map to generate an extracted dispersion curve; and determining a body wave slowness from the extracted dispersion curve.

Statement 2: A method according to Statement 1, further comprising: obtaining prior known borehole characteristics; generating a dispersion model based on the prior known borehole characteristics; generating a self-adaptive weighting function based on the dispersion model and the extracted dispersion curve; applying the self-adaptive weighting function to the frequency domain data of the extracted dispersion curve to generate a weighted dispersion curve; fitting, using an inversion procedure, the weighted dispersion curve and the dispersion model; and determining a body wave slowness that minimizes the misfit between the weighted dispersion curve and the dispersion model.

Statement 3: A method according to Statement 1 or Statement 2, further comprising: lowering an acoustic logging tool to a depth in a borehole corresponding to a target formation zone.

Statement 4: A method according to Statement 3, further comprising: causing the acoustic logging tool to acquire a plurality of waveform data sets corresponding to a target formation zone, wherein each waveform data set is acquired at a different shot position.

Statement 5: A method according to any one of the preceding Statements 1-4, wherein the guided borehole waves are selected from the group consisting of flexural waves, screw waves, and leaky-P waves.

Statement 6: A method according to any one of the preceding Statements 1-5, wherein the prior known borehole characteristics are selected from the group consisting of borehole fluid type, borehole diameter, formation density, compressional slowness, and any combination thereof.

Statement 7: A method according to any one of the preceding Statements 1-6, wherein the dispersion model is an exact dispersion model based on a forward modeling method.

Statement 8: A method according to any one of the preceding Statements 1-6, wherein the dispersion model is a simplified dispersion model based on a data-driven method having adjustable parameters.

Statement 9: A method according to any one of the preceding Statement 1-8, wherein each of the different shot positions corresponds to a discrete wellbore depth.

Statement 10: A method of determining body wave slowness from guided borehole waves, the method comprising: selecting a target axial resolution based on the size of the receiver array; obtaining a plurality of waveform data sets corresponding to a target formation zone, wherein each waveform data set is acquired at a different shot position; generating a self-adaptive weighting function; applying the self-adaptive weighting function to the time domain data of each waveform data set to generate weighted waveform data sets; and filtering the weighted waveform data sets based on the weights to enhance the preferred frequency of the data and to generate filtered waveform data sets.

Statement 11: A method according to Statement 10, further comprising: obtaining prior known borehole characteristics; generating a dispersion model based on the prior known borehole characteristics; propagating the filtered waveform data sets to different receivers using the dispersion model; computing a set of 1D semblance/coherence variable density logs (VDLs) in a truncated time-window using the propagated waveforms; stacking the VDLs to generate an enhanced VDL having an improved signal-to-noise ratio; and determining a body wave slowness by tracking peaks on the VDL data.

Statement 12: A method according to Statement 11, further comprising: generating a second dispersion model by adjusting one or more adjustable parameters so as to minimize the misfit between the dispersion model and the filtered waveform data sets.

Statement 13: A method according to any one of the preceding Statements 10-12, further comprising: lowering an acoustic logging tool to a depth in a borehole corresponding to a target formation zone.

Statement 14: A method according to Statement 13, further comprising: causing the acoustic logging tool to acquire a plurality of waveform data sets corresponding to a target formation zone, wherein each waveform data set is acquired at a different shot position.

Statement 15: A method according to any one of the preceding Statements 10-14, wherein the guided borehole waves are selected from the group consisting of flexural waves, screw waves, and leaky-P waves.

Statement 16: A method according to any one of the preceding Statements 10-15, wherein the prior known borehole characteristics are selected from the group consisting of borehole fluid type, borehole diameter, formation density, compressional slowness, and any combination thereof.

Statement 17: A method according to any one of the preceding Statements 10-16, wherein the dispersion model is an exact dispersion model based on a forward modeling method.

Statement 18: A method according to any one of the preceding Statements 10-16, wherein the dispersion model is a simplified dispersion model based on a data-driven method having adjustable parameters.

Statement 19: A method according to any one of the preceding Statements 10-18, wherein each of the different shot positions corresponds to a discrete wellbore depth.

Statement 20: An apparatus comprising: an acoustic logging tool having a receiver array, the acoustic logging tool configured to acquire a plurality of waveform data sets corresponding to a target formation zone, wherein each waveform data set is acquired at a different shot position; at least one processor in communication with the acoustic logging tool, wherein the processor is coupled with a non-transitory computer-readable storage medium having stored therein instructions which, when executed by the at least one processor, causes the at least one processor to: select a target axial resolution based on the size of a receiver array; obtain a plurality of waveform data sets corresponding to a target formation zone, wherein each waveform data set is acquired at a different shot position; compute a slowness-frequency 2D dispersion semblance map for each waveform data set; stack the slowness-frequency 2D dispersion semblance maps to generate a stacked 2D semblance map; extract a dispersion curve from the stacked 2D semblance map to generate an extracted dispersion curve; and determine a body wave slowness from the extracted dispersion curve.

Statement 21: An apparatus according to Statement 20, wherein the non-transitory computer-readable storage medium further contains a set of instructions that when executed by the at least one processor, further causes the at least one processor to: obtain prior known borehole characteristics; generate a dispersion model based on the prior known borehole characteristics; generate a self-adaptive weighting function based on the dispersion model and the extracted dispersion curve; apply the self-adaptive weighting function to the frequency domain data of the extracted dispersion curve to generate a weighted dispersion curve; fit, using an inversion procedure, the weighted dispersion curve and the dispersion model; and determine a body wave slowness that minimizes the misfit between the weighted dispersion curve and the dispersion model.

Statement 22: An apparatus according to Statement 20 or Statement 21, wherein the guided borehole waves are selected from the group consisting of flexural waves, screw waves, and leaky-P waves.

Statement 23: An apparatus according to any one of the preceding Statements 20-22, wherein the prior known borehole characteristics are selected from the group consisting of borehole fluid type, borehole diameter, formation density, compressional slowness, and any combination thereof.

Statement 24: A system comprising: an acoustic logging tool disposed within a wellbore, the acoustic logging tool having a receiver array and configured to acquire a plurality of waveform data sets corresponding to a target formation zone, wherein each waveform data set is acquired at a different shot position; at least one processor in communication with the acoustic logging tool, wherein the processor is coupled with a non-transitory computer-readable storage medium having stored therein instructions which, when executed by the at least one processor, causes the at least one processor to: select a target axial resolution based on the size of a receiver array; obtain a plurality of waveform data sets corresponding to a target formation zone, wherein each waveform data set is acquired at a different shot position; compute a slowness-frequency 2D dispersion semblance map for each waveform data set; stack the slowness-frequency 2D dispersion semblance maps to generate a stacked 2D semblance map; extract a dispersion curve from the stacked 2D semblance map to generate an extracted dispersion curve; and determine a body wave slowness from the extracted dispersion curve.

Statement 25: A system according to Statement 24, wherein the non-transitory computer-readable storage medium further contains a set of instructions that when executed by the at least one processor, further causes the at least one processor to: obtain prior known borehole characteristics; generate a dispersion model based on the prior known borehole characteristics; generate a self-adaptive weighting function based on the dispersion model and the extracted dispersion curve; apply the self-adaptive weighting function to the frequency domain data of the extracted dispersion curve to generate a weighted dispersion curve; fit, using an inversion procedure, the weighted dispersion curve and the dispersion model; and determine a body wave slowness that minimizes the misfit between the weighted dispersion curve and the dispersion model.

Statement 26: A system according to Statement 24 or Statement 25, wherein the guided borehole waves are selected from the group consisting of flexural waves, screw waves, and leaky-P waves.

Statement 27: A system according to any one of the preceding Statements 24-26, wherein the prior known borehole characteristics are selected from the group consisting of borehole fluid type, borehole diameter, formation density, compressional slowness, and any combination thereof.

Statement 28: An apparatus comprising: an acoustic logging tool having a receiver array, the acoustic logging tool configured to acquire a plurality of waveform data sets corresponding to a target formation zone, wherein each waveform data set is acquired at a different shot position; at least one processor in communication with the acoustic logging tool, wherein the processor is coupled with a non-transitory computer-readable storage medium having stored therein instructions which, when executed by the at least one processor, causes the at least one processor to: select a target axial resolution based on the size of the receiver array; obtain a plurality of waveform data sets corresponding to a target formation zone, wherein each waveform data set is acquired at a different shot position; generate a self-adaptive weighting function; apply the self-adaptive weighting function to the time domain data of each waveform data set to generate weighted waveform data sets; and filter the weighted waveform data sets based on the weights to enhance the preferred frequency of the data and to generate filtered waveform data sets.

Statement 29: An apparatus according to Statement 28, wherein the non-transitory computer-readable storage medium further contains a set of instructions that when executed by the at least one processor, further causes the at least one processor to: obtain prior known borehole characteristics; generate a dispersion model based on the prior known borehole characteristics; propagate the filtered waveform data sets to different receivers using the dispersion model; compute a set of 1D semblance/coherence variable density logs (VDLs) in a truncated time-window using the propagated waveforms; stacking the VDLs to generate an enhanced VDL having an improved signal-to-noise ratio; and determine a body wave slowness by tracking peaks on the VDL data.

Statement 30: An apparatus according to Statement 29, wherein the non-transitory computer-readable storage medium further contains a set of instructions that when executed by the at least one processor, further causes the at least one processor to: generate a second dispersion model by adjusting one or more adjustable parameters so as to minimize the misfit between the dispersion model and the filtered waveform data sets.

Statement 31: An apparatus according to any one of the preceding Statements 28-30, wherein the guided borehole waves are selected from the group consisting of flexural waves, screw waves, and leaky-P waves.

Statement 32: An apparatus according to any one of the preceding Statements 28-31, wherein the prior known borehole characteristics are selected from the group consisting of borehole fluid type, borehole diameter, formation density, compressional slowness, and any combination thereof.

Statement 33: A system comprising: an acoustic logging tool disposed within a wellbore, the acoustic logging tool having a receiver array and configured to acquire a plurality of waveform data sets corresponding to a target formation zone, wherein each waveform data set is acquired at a different shot position; at least one processor in communication with the acoustic logging tool, wherein the processor is coupled with a non-transitory computer-readable storage medium having stored therein instructions which, when executed by the at least one processor, causes the at least one processor to: select a target axial resolution based on the size of the receiver array; obtain a plurality of waveform data sets corresponding to a target formation zone, wherein each waveform data set is acquired at a different shot position; generate a self-adaptive weighting function; apply the self-adaptive weighting function to the time domain data of each waveform data set to generate weighted waveform data sets; and filter the weighted waveform data sets based on the weights to enhance the preferred frequency of the data and to generate filtered waveform data sets.

Statement 34: A system according to Statement 33, wherein the non-transitory computer-readable storage medium further contains a set of instructions that when executed by the at least one processor, further causes the at least one processor to: obtain prior known borehole characteristics; generate a dispersion model based on the prior known borehole characteristics; propagate the filtered waveform data sets to different receivers using the dispersion model; compute a set of 1D semblance/coherence variable density logs (VDLs) in a truncated time-window using the propagated waveforms; stacking the VDLs to generate an enhanced VDL having an improved signal-to-noise ratio; and determine a body wave slowness by tracking peaks on the VDL data.

Statement 35: A system according to Statement 34, wherein the non-transitory computer-readable storage medium further contains a set of instructions that when executed by the at least one processor, further causes the at least one processor to: generate a second dispersion model by adjusting one or more adjustable parameters so as to minimize the misfit between the dispersion model and the filtered waveform data sets.

Statement 36: A system according to any one of the preceding Statements 33-35, wherein the guided borehole waves are selected from the group consisting of flexural waves, screw waves, and leaky-P waves.

Statement 37: A system according to any one of the preceding Statements 33-36, wherein the prior known borehole characteristics are selected from the group consisting of borehole fluid type, borehole diameter, formation density, compressional slowness, and any combination thereof.

We claim:

1. A method of determining body wave slowness from guided borehole waves, the method comprising:
   selecting a target axial resolution based on a size of a receiver array;
   obtaining a plurality of waveform data sets corresponding to a target formation zone, wherein each waveform data set is acquired at a different shot position;
   computing a slowness-frequency 2D dispersion semblance map for each waveform data set based on frequency phase difference values in the plurality of waveform data sets;
   stacking the slowness-frequency 2D dispersion semblance maps to generate a stacked 2D semblance map;
   extracting a dispersion curve from the stacked 2D semblance map to generate an extracted dispersion curve; and
   determining the body wave slowness from the extracted dispersion curve.

2. The method of claim 1, further comprising:
   obtaining prior known borehole characteristics;
   generating a dispersion model based on the prior known borehole characteristics;
   generating a self-adaptive weighting function based on the dispersion model and the extracted dispersion curve;
   applying the self-adaptive weighting function to frequency domain data of the extracted dispersion curve to generate a weighted dispersion curve;
   fitting, using an inversion procedure, the weighted dispersion curve and the dispersion model; and
   determining the body wave slowness that minimizes a misfit between the weighted dispersion curve and the dispersion model.

3. The method of claim 2, further comprising:
   lowering an acoustic logging tool to a depth in a borehole corresponding to the target formation zone.

4. The method of claim 3, further comprising:
   causing the acoustic logging tool to acquire the plurality of waveform data sets corresponding to the target formation zone, wherein each waveform data set is acquired at the different shot position.

5. The method of claim 2, wherein the guided borehole waves are selected from a group consisting of flexural waves, screw waves, and leaky-P waves.

6. The method of claim 2, wherein the prior known borehole characteristics are selected from a group consisting of borehole fluid type, borehole diameter, formation density, compressional slowness, and any combination thereof.

7. An apparatus comprising:
   an acoustic logging tool having a receiver array, the acoustic logging tool configured to acquire a plurality of waveform data sets corresponding to a target formation zone, wherein each waveform data set is acquired at a different shot position;
   at least one processor in communication with the acoustic logging tool, wherein the at least one processor is coupled with a non-transitory computer-readable storage medium having stored therein instructions which, when executed by the at least one processor, causes the at least one processor to:
   select a target axial resolution based on a size of the receiver array;
   obtain the plurality of waveform data sets corresponding to the target formation zone, wherein each waveform data set is acquired at the different shot position;

compute a slowness-frequency 2D dispersion semblance map for each waveform data set based on frequency phase difference values in the plurality of waveform data sets;

stack the slowness-frequency 2D dispersion semblance maps to generate a stacked 2D semblance map;

extract a dispersion curve from the stacked 2D semblance map to generate an extracted dispersion curve; and determine a body wave slowness from the extracted dispersion curve.

8. The apparatus of claim 7, wherein the non-transitory computer-readable storage medium further contains a set of instructions that when executed by the at least one processor, further causes the at least one processor to:

obtain prior known borehole characteristics;

generate a dispersion model based on the prior known borehole characteristics;

generate a self-adaptive weighting function based on the dispersion model and the extracted dispersion curve;

apply the self-adaptive weighting function to frequency domain data of the extracted dispersion curve to generate a weighted dispersion curve;

fit, using an inversion procedure, the weighted dispersion curve and the dispersion model; and determine the body wave slowness that minimizes a misfit between the weighted dispersion curve and the dispersion model.

9. The apparatus of claim 8, wherein the guided borehole waves are selected from a group consisting of flexural waves, screw waves, and leaky-P waves.

10. The apparatus of claim 8, wherein the prior known borehole characteristics are selected from a group consisting of borehole fluid type, borehole diameter, formation density, compressional slowness, and any combination thereof.

* * * * *